(12) United States Patent
Yamazaki et al.

(10) Patent No.: US 10,297,322 B2
(45) Date of Patent: *May 21, 2019

(54) MEMORY DEVICE WITH A DRIVING CIRCUIT COMPRISING TRANSISTORS EACH HAVING TWO GATE ELECTRODES AND AN OXIDE SEMICONDUCTOR LAYER

(71) Applicant: Semiconductor Energy Laboratory Co., Ltd., Atsugi-shi, Kanagawa-ken (JP)

(72) Inventors: Shunpei Yamazaki, Setagaya (JP); Jun Koyama, Sagamihara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/219,773

(22) Filed: Jul. 26, 2016

(65) Prior Publication Data

US 2016/0336068 A1 Nov. 17, 2016

Related U.S. Application Data

(60) Continuation of application No. 14/257,188, filed on Apr. 21, 2014, now Pat. No. 9,449,706, which is a
(Continued)

(30) Foreign Application Priority Data

Aug. 27, 2010 (JP) ................................. 2010-190344

(51) Int. Cl.
*G11C 8/08* (2006.01)
*G11C 14/00* (2006.01)
(Continued)

(52) U.S. Cl.
CPC ............ *G11C 14/0018* (2013.01); *G11C 8/08* (2013.01); *G11C 11/401* (2013.01);
(Continued)

(58) Field of Classification Search
None
See application file for complete search history.

(56) References Cited

U.S. PATENT DOCUMENTS 5,581,106 A 12/1996 Hayashi et al.
5,600,588 A 2/1997 Kawashima
(Continued)

FOREIGN PATENT DOCUMENTS

CN 001570996 A 1/2005
CN 101714870 A 5/2010
(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.
(Continued)

*Primary Examiner* — J. H. Hur
(74) *Attorney, Agent, or Firm* — Robinson Intellectual Property Law Office; Eric J. Robinson

(57) ABSTRACT

A memory device in which data can be retained for a long time is provided. The memory device includes a memory element and a transistor which functions as a switching element for controlling supply, storage, and release of electrical charge in the memory element. The transistor includes a second gate electrode for controlling the threshold voltage in addition to a normal gate electrode. Further, the off-state current of the transistor is extremely low because an active layer thereof includes an oxide semiconductor. In the
(Continued)

memory device, data is stored not by injection of electrical charge to a floating gate surrounded by an insulating film at high voltage but by control of the amount of electrical charge of the memory element through the transistor whose off-state current is extremely low.

12 Claims, 18 Drawing Sheets

Related U.S. Application Data division of application No. 13/215,489, filed on Aug. 23, 2011, now Pat. No. 8,737,109.

(51) Int. Cl.
- *G11C 16/02* (2006.01)
- *G11C 16/04* (2006.01)
- *G11C 16/34* (2006.01)
- *H01L 27/12* (2006.01)
- *G11C 11/401* (2006.01)
- *G11C 11/403* (2006.01)
- *H01L 27/1156* (2017.01)

(52) U.S. Cl.
CPC ............ *G11C 11/403* (2013.01); *G11C 16/02* (2013.01); *G11C 16/0408* (2013.01); *G11C 16/0433* (2013.01); *G11C 16/34* (2013.01); *H01L 27/1156* (2013.01); *H01L 27/1225* (2013.01)

(56) References Cited

U.S. PATENT DOCUMENTS

| | | | |
|---|---|---|---|
| 5,721,444 A | 2/1998 | Oashi et al. | |
| 5,731,856 A | 3/1998 | Kim et al. | |
| 5,740,102 A | 4/1998 | Kawashima | |
| 5,744,864 A | 4/1998 | Cillessen et al. | |
| 5,892,267 A * | 4/1999 | Takada ................. | H02M 3/073 327/536 |
| 6,064,589 A | 5/2000 | Walker | |
| 6,150,687 A | 11/2000 | Noble et al. | |
| 6,248,626 B1 | 6/2001 | Kumar et al. | |
| 6,294,274 B1 | 9/2001 | Kawazoe et al. | |
| 6,563,174 B2 | 5/2003 | Kawasaki et al. | |
| 6,646,949 B1 | 11/2003 | Ellis et al. | |
| 6,727,522 B1 | 4/2004 | Kawasaki et al. | |
| 6,912,159 B2 | 6/2005 | Osawa et al. | |
| 7,030,681 B2 | 4/2006 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,250,720 B2 | 7/2007 | Sakakura et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,675,785 B2 | 3/2010 | Takahashi | |
| 7,714,633 B2 | 5/2010 | Kato | |
| 7,732,819 B2 | 6/2010 | Akimoto et al. | |
| 7,940,085 B2 | 5/2011 | Kim et al. | |
| 7,977,675 B2 | 7/2011 | Kawamura et al. | |
| 8,018,403 B2 | 9/2011 | Sakakura et al. | |
| 8,106,400 B2 | 1/2012 | Miyairi et al. | |
| 8,139,001 B2 | 3/2012 | Sakakura et al. | |
| 8,144,102 B2 | 3/2012 | Takatoku | |
| 8,188,477 B2 | 5/2012 | Miyairi et al. | |
| 8,218,099 B2 | 7/2012 | Yamazaki et al. | |
| 8,269,218 B2 | 9/2012 | Yamazaki | |
| 8,378,341 B2 | 2/2013 | Hayashi et al. | |
| 8,502,220 B2 | 8/2013 | Yamazaki et al. | |
| 8,502,225 B2 | 8/2013 | Yamazaki et al. | |
| 8,513,661 B2 | 8/2013 | Takahashi et al. | |
| 8,518,739 B2 | 8/2013 | Miyairi et al. | |
| 8,530,246 B2 | 9/2013 | Ofuji et al. | |
| 8,541,846 B2 | 9/2013 | Saito | |
| 8,552,423 B2 | 10/2013 | Yamazaki et al. | |
| 8,674,908 B2 | 3/2014 | Sakakura et al. | |
| 8,737,109 B2 * | 5/2014 | Yamazaki ............... | G11C 16/02 365/149 |
| 8,742,412 B2 | 6/2014 | Goyal et al. | |
| 9,000,431 B2 | 4/2015 | Miyairi et al. | |
| 9,000,441 B2 | 4/2015 | Kawae et al. | |
| 9,054,203 B2 | 6/2015 | Miyairi et al. | |
| 9,129,937 B2 | 9/2015 | Hayashi et al. | |
| 9,219,158 B2 | 12/2015 | Miyairi et al. | |
| 9,312,394 B2 | 4/2016 | Hayashi et al. | |
| 9,449,706 B2 * | 9/2016 | Yamazaki ............... | G11C 16/02 |
| 2001/0030323 A1 | 10/2001 | Ikeda | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0149048 A1 | 10/2002 | Noble et al. | |
| 2002/0171461 A1 | 11/2002 | Yamazaki et al. | |
| 2002/0172070 A1 | 11/2002 | Arimoto et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0095806 A1 | 5/2004 | Osawa et al. | |
| 2004/0127038 A1 | 7/2004 | Carcia et al. | |
| 2004/0246765 A1 | 12/2004 | Kato | |
| 2004/0264279 A1 * | 12/2004 | Wordeman ........ | G11C 11/40603 365/230.05 |
| 2005/0017302 A1 | 1/2005 | Hoffman | |
| 2005/0052220 A1 * | 3/2005 | Burgener ............... | H02M 3/073 327/536 |
| 2005/0199959 A1 | 9/2005 | Chiang et al. | |
| 2005/0276094 A1 * | 12/2005 | Yamaoka ............... | G11C 11/412 365/154 |
| 2005/0282317 A1 | 12/2005 | Ikeda | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0118869 A1 | 6/2006 | Lan et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |

(56) References Cited

U.S. PATENT DOCUMENTS

| | | |
|---|---|---|
| 2007/0194379 A1 | 8/2007 | Hosono et al. |
| 2007/0215925 A1 | 9/2007 | Takahashi |
| 2007/0252928 A1 | 11/2007 | Ito et al. |
| 2007/0272922 A1 | 11/2007 | Kim et al. |
| 2007/0272948 A1 | 11/2007 | Koo et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0143653 A1* | 6/2008 | Shishido ............ G09G 3/3233 345/78 |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0273366 A1 | 11/2008 | Braceras et al. |
| 2008/0296568 A1 | 12/2008 | Ryu et al. |
| 2009/0010056 A1 | 1/2009 | Kuo et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0025675 A1 | 2/2010 | Yamazaki et al. |
| 2010/0065841 A1 | 3/2010 | Lee et al. |
| 2010/0065844 A1 | 3/2010 | Tokunaga |
| 2010/0079169 A1 | 4/2010 | Kim et al. |
| 2010/0092800 A1 | 4/2010 | Itagaki et al. |
| 2010/0096628 A1 | 4/2010 | Song et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0244029 A1 | 9/2010 | Yamazaki et al. |
| 2011/0012117 A1 | 1/2011 | Yamazaki et al. |
| 2011/0031497 A1 | 2/2011 | Yamazaki et al. |
| 2011/0076790 A1 | 3/2011 | Ofuji et al. |
| 2011/0079777 A1 | 4/2011 | Akimoto |
| 2011/0079784 A1 | 4/2011 | Im |
| 2011/0102409 A1 | 5/2011 | Hayakawa |
| 2011/0156025 A1 | 6/2011 | Shionoiri et al. |
| 2011/0175647 A1 | 7/2011 | Kim et al. |
| 2011/0175674 A1 | 7/2011 | Shimizu et al. |
| 2011/0198483 A1 | 8/2011 | Kurokawa |
| 2011/0248261 A1 | 10/2011 | Yamazaki |
| 2011/0286256 A1 | 11/2011 | Kamata |
| 2011/0304311 A1 | 12/2011 | Takahashi et al. |
| 2012/0112191 A1 | 5/2012 | Kato et al. |
| 2016/0211173 A1 | 7/2016 | Hayashi et al. |

FOREIGN PATENT DOCUMENTS

| | | |
|---|---|---|
| EP | 1737044 A | 12/2006 |
| EP | 2172972 A | 4/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-167073 A | 7/1993 |
| JP | 05-251705 A | 9/1993 |
| JP | 06-021478 A | 1/1994 |
| JP | 07-176184 A | 7/1995 |
| JP | 07-211079 A | 8/1995 |
| JP | 08-264794 A | 10/1996 |
| JP | 10199241 A * | 7/1998 |
| JP | 10-256560 A | 9/1998 |
| JP | 11-144466 A | 5/1999 |
| JP | 11-505377 | 5/1999 |
| JP | 2000-044236 A | 2/2000 |
| JP | 2000-124418 A | 4/2000 |
| JP | 2000-150900 A | 5/2000 |
| JP | 2001-093989 A | 4/2001 |
| JP | 2002-076356 A | 3/2002 |
| JP | 2002-289859 A | 10/2002 |
| JP | 2002-343083 A | 11/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-171657 A | 6/2004 |
| JP | 2004-273614 A | 9/2004 |
| JP | 2004-273732 A | 9/2004 |
| JP | 2005-322899 A | 11/2005 |
| JP | 2007-251050 A | 9/2007 |
| JP | 2008-522440 | 6/2008 |
| JP | 2009-094927 A | 4/2009 |
| JP | 2009-176865 A | 8/2009 |
| JP | 2009-206508 A | 9/2009 |
| JP | 2009-277702 A | 11/2009 |
| JP | 2010-087518 A | 4/2010 |
| JP | 2010-123938 A | 6/2010 |
| JP | 2010-141230 A | 6/2010 |
| JP | 2011-082487 A | 4/2011 |
| JP | 2011-146574 A | 7/2011 |
| KR | 2001-0093719 A | 10/2001 |
| KR | 2001-0096719 A | 11/2001 |
| KR | 2007-0107677 A | 11/2007 |
| KR | 10-0815064 | 3/2008 |
| KR | 2009-0039611 A | 4/2009 |
| KR | 2010-0017059 A | 2/2010 |
| KR | 2010-0037407 A | 4/2010 |
| KR | 2010-0045922 A | 5/2010 |
| KR | 2010-0054091 A | 5/2010 |
| KR | 2011-0037220 A | 4/2011 |
| WO | WO-2004/114391 | 12/2004 |
| WO | WO-2006/060521 | 6/2006 |
| WO | WO-2009/093722 | 7/2009 |
| WO | WO-2009/096608 | 8/2009 |
| WO | WO-2009/139482 | 11/2009 |
| WO | WO-2010/047217 | 4/2010 |

OTHER PUBLICATIONS

International Search Report (Application No. PCT/JP2011/069105) dated Nov. 29, 2011.

Written Opinion (Application No. PCT/JP2011/069105) dated Nov. 29, 2011.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by

(56) References Cited

OTHER PUBLICATIONS

Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 IN. QVGA AMOLED Display Using In—Ga—Zn-Oxide TFTs With a Novel Passivation Layer", SID Digest '09 : SID International Symposium of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

(56) References Cited

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-cryst. Solids (Journal of Non-crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

German Office Action (Application No. 112011102837.7) dated Jan. 11, 2016.

Taiwanese Office Action (Application No. 100130485) dated Mar. 14, 2016.

Taiwanese Office Action (Application No. 106112242) dated Aug. 8, 2017.

Korean Office Action (Application No. 2013-7007228) dated Sep. 27, 2017.

Korean Office Action (Application No. 2013-7007228) dated Mar. 30, 2018.

German Office Action (Application No. 112011102837.7) dated Sep. 12, 2018.

Taiwanese Office Action (Application No. 107113575) dated Nov. 26, 2018.

German Office Action (Application No. 112011102837.7) dated Mar. 12, 2019

\* cited by examiner

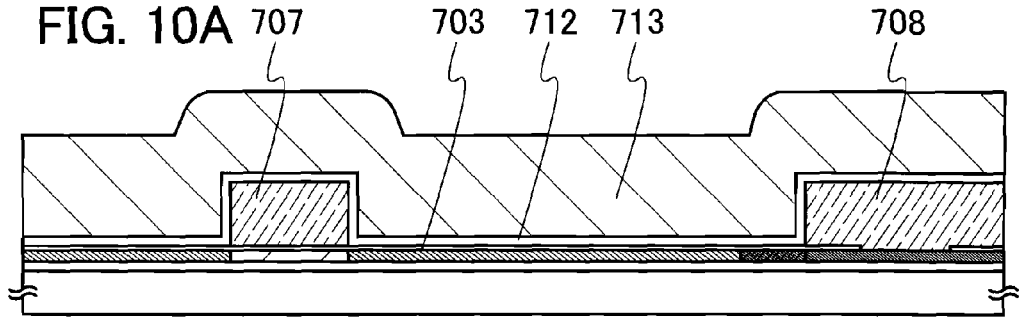
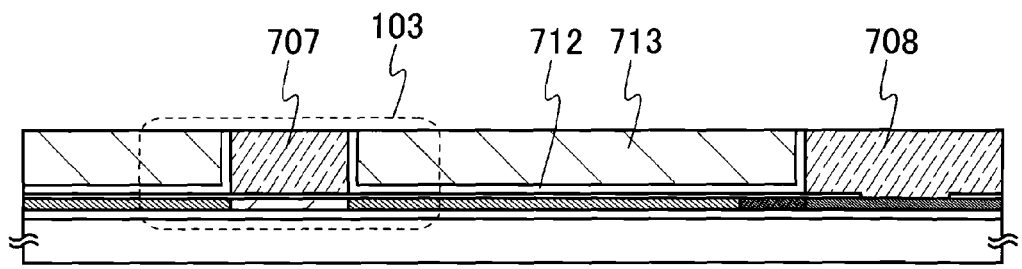
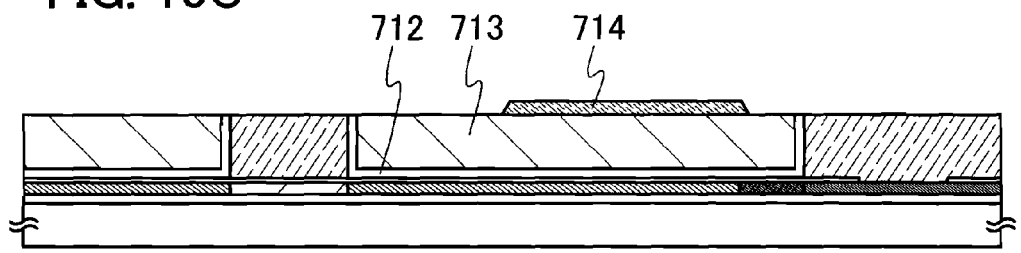
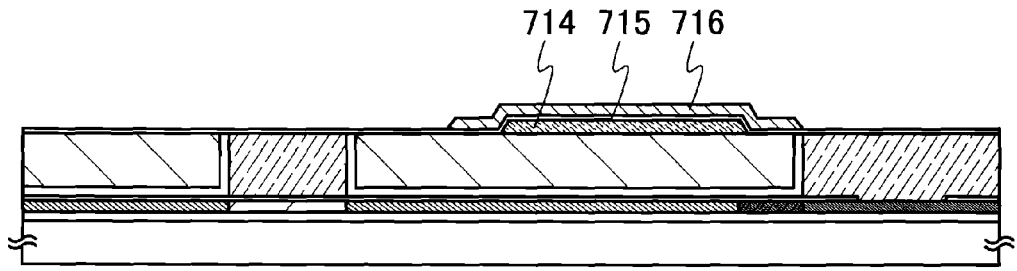

MEMORY DEVICE WITH A DRIVING CIRCUIT COMPRISING TRANSISTORS EACH HAVING TWO GATE ELECTRODES AND AN OXIDE SEMICONDUCTOR LAYER

TECHNICAL FIELD

The present invention relates to non-volatile semiconductor memory devices. In particular, the present invention relates to structures of memory cells for retaining data.

BACKGROUND ART

Examples of a semiconductor memory device (hereinafter simply referred to as a memory device) include a DRAM and an SRAM, which are categorized as volatile memories; a mask ROM, an EPROM, an EEPROM, a flash memory, and a ferroelectric memory, which are categorized as non-volatile memories; and the like. Most of these memories formed using single crystal semiconductor substrates have already been put into practical use. Among the semiconductor memories, flash memories become available on the market and are mainly used for portable storage media such as USB memories and memory cards. The reason for this is that flash memories resist physical shock and can be conveniently used because they are non-volatile memories which can repeatedly write and erase data and can retain data without supply of power.

As flash memories, there are a NAND flash memory in which a plurality of memory cells are connected in series and a NOR flash memory in which a plurality of memory cells are arranged in matrix. Each flash memory has a transistor which functions as a memory element in each memory cell. Further, the transistor which functions as a memory element has an electrode for accumulating electrical charge that is called a floating gate between a gate electrode and a semiconductor film serving as an active layer. Accumulation of electrical charge in the floating gate enables data retention.

References 1 and 2 each disclose a thin film transistor including a floating gate formed over a glass substrate.

REFERENCE

Reference 1: Japanese Published Patent Application No. 6-021478
Reference 2: Japanese Published Patent Application No. 2005-322899

DISCLOSURE OF INVENTION

In general, the absolute value of voltage applied to a memory element in a non-volatile memory at the time of writing data is approximately 20 V, which tends to be higher than the absolute value of voltage applied to a memory element in a volatile memory. In the case of a flash memory which can repeatedly rewrite data, it is necessary to apply high voltage to a transistor used as a memory element at the time of data erasing as well as data writing. Accordingly, power consumption is high when a flash memory operates, for example, in data writing and data erasing, which is one factor that prevents reduction in power consumption of an electronic device including a flash memory as a memory device. In particular, in the case where a flash memory is used for a portable electronic device such as a camera or a cellular phone, high power consumption leads to a disadvantage of short continuous operating time.

In addition, although a flash memory is a non-volatile memory, data is lost by leakage of a slight amount of electrical charge. Thus, a data retention period is approximately 5 to 10 years so far, and it is hoped that a flash memory capable of securing a longer data retention period is realized.

Further, although a flash memory can repeatedly write and erase data, a gate insulating film easily deteriorates by tunnel current when electrical charge is accumulated in a floating gate. Accordingly, the frequency of rewrite of data in one memory element is at most approximately several ten thousands to several hundreds thousand times, and it is hoped that a flash memory which can rewrite data more than several ten thousands to several hundreds thousand times is realized.

In view of the problems, it is an object of the present invention to provide a memory device whose power consumption can be reduced and a semiconductor device including the memory device. It is an object of the present invention to provide a memory device which can retain data for a longer period and a semiconductor device including the memory device. It is an object of the present invention to provide a memory device in which the frequency of rewrite of data can be increased and a semiconductor device including the memory device.

A memory device according to one embodiment of the present invention includes a memory element and a transistor which functions as a switching element for controlling supply, storage, and release of electrical charge in the memory element. In the memory device, data is stored not by injection of electrical charge into a floating gate surrounded by an insulating film at high voltage but by control of the amount of electrical charge in the memory element through the transistor whose off-state current is extremely low.

Specifically, the band gap of the transistor is wider than that of silicon, and a channel formation region of the transistor includes a semiconductor material whose intrinsic carrier density is lower than that of silicon. With a channel formation region including a semiconductor material having the above characteristics, a transistor whose off-state current is extremely low can be realized. As such a semiconductor material, for example, an oxide semiconductor, silicon carbide, gallium nitride, or the like having a band gap which is approximately three times as wide as that of silicon can be used. A transistor including the semiconductor material can have much lower off-state current than a transistor including a normal semiconductor material such as silicon or germanium.

Further, the transistor which functions as a switching element includes a second gate electrode for controlling the threshold voltage in addition to a normal gate electrode. The transistor may be any transistor as long as it is an insulated gate field-effect transistor. Specifically, the transistor includes a first gate electrode, a second gate electrode, a semiconductor film positioned between the first gate electrode and the second gate electrode, a first insulating film positioned between the first gate electrode and the semiconductor film, a second insulating film positioned between the second gate electrode and the semiconductor film, and a source electrode and a drain electrode connected to the semiconductor film. With such a structure, it is possible to adjust the threshold voltage so that the off-state current of the transistor is decreased by control of a potential difference between the source electrode and the second gate electrode.

When the off-state current of the transistor which functions as a switching element is markedly decreased, in a data retention period (a retention period), electrical charge accumulated in the memory element can be prevented from leaking through the transistor.

Note that a highly-purified oxide semiconductor (a purified oxide semiconductor) obtained by reduction of impurities such as moisture or hydrogen which serve as electron donors (donors) and reduction of oxygen deficiency is an intrinsic (i-type) semiconductor or a substantially intrinsic semiconductor. Thus, a transistor including the oxide semiconductor has extremely low off-state current. Specifically, the concentration of hydrogen in the highly-purified oxide semiconductor that is measured by secondary ion mass spectrometry (SIMS) is $5\times10^{19}/cm^3$ or lower, preferably $5\times10^{18}/cm^3$ or lower, more preferably $5\times10^{17}/cm^3$ or lower, still more preferably $1\times10^{16}/cm^3$ or lower. In addition, the carrier density of the oxide semiconductor that can be measured by Hall effect measurement is lower than $1\times10^{14}/cm^3$, preferably lower than $1\times10^{12}/cm^3$, more preferably lower than $1\times10^{11}/cm^3$. Further, the band gap of the oxide semiconductor is 2 eV or more, preferably 2.5 eV or more, more preferably 3 eV or more. With the use of an oxide semiconductor film which is highly purified by a sufficient decrease in the concentration of impurities such as moisture or hydrogen and reduction of oxygen deficiency, the off-state current of the transistor can be decreased.

The analysis of the concentration of hydrogen in the oxide semiconductor film is described here. The concentration of hydrogen in the oxide semiconductor film is measured by SIMS. It is known that it is difficult to obtain precise data in the vicinity of a surface of a sample or in the vicinity of an interface between stacked films formed using different materials by SIMS in principle. Thus, in the case where the distribution of the concentration of hydrogen in the film in a thickness direction is analyzed by SIMS, an average value in a region of the film in which the value is not greatly changed and substantially the same value can be obtained is employed as the hydrogen concentration. In addition, in the case where the thickness of the film is small, a region where substantially the same value can be obtained cannot be found in some cases due to the influence of the hydrogen concentration of the films adjacent to each other. In that case, the maximum value or the minimum value of the hydrogen concentration in the region of the film is employed as the hydrogen concentration of the film. Further, in the case where a mountain-shaped peak having the maximum value or a valley-shaped peak having the minimum value do not exist in the region of the film, the value at an inflection point is employed as the hydrogen concentration.

Specifically, various experiments can prove low off-state current of a transistor including a highly-purified oxide semiconductor film as an active layer. For example, even when an element has a channel width of $1\times10^6$ μm and a channel length of 10 μM, off-state current can be lower than or equal to the measurement limit of a semiconductor parameter analyzer, i.e., lower than or equal to $1\times10^{-13}$ A, at a voltage (drain voltage) between a source electrode and a drain electrode of 1 to 10 V. In that case, it can be seen that off-state current density corresponding to a value obtained by division of the off-state current by the channel width of the transistor is lower than or equal to 100 zA/μm. In addition, a capacitor and a transistor were connected to each other and off-state current density was measured using a circuit in which electrical charge flowing to or from the capacitor was controlled by the transistor. In the measurement, a highly-purified oxide semiconductor is used for an active layer of the transistor, and the off-state current density of the transistor was measured from a change in the amount of electrical charge of the capacitor per unit hour. As a result, it can be seen that, in the case where the voltage between the source electrode and the drain electrode of the transistor was 3 V, a lower off-state current density of several tens yocto-ampere per micrometer (yA/μm) is obtained. Thus, in a semiconductor device according to one embodiment of the present invention, the off-state current density of the transistor including the highly-purified oxide semiconductor film as an active layer can be 100 yA/μm or lower, preferably 10 yA/μm or lower, more preferably 1 yA/μm or lower depending on the voltage between the source electrode and the drain electrode. Accordingly, the transistor including the highly-purified oxide semiconductor film as an active layer has much lower off-state current than a transistor including crystalline silicon.

Note that as the oxide semiconductor, preferably an oxide semiconductor containing In or Zn, more preferably an oxide semiconductor containing In and Ga or an oxide semiconductor containing In and Zn is used. In order to obtain an intrinsic (i-type) oxide semiconductor film, dehydration or dehydrogenation to be described later is effective. As a stabilizer for reducing variations in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. The oxide semiconductor may include silicon.

Note that, for example, an In—Ga—Zn-based oxide means an oxide containing In, Ga, and Zn, and there is no limitation on the ratio of In, Ga, and Zn. In addition, the In—Ga—Zn—O-based oxide may contain a metal element other than In, Ga, and Zn. The In—Ga—Zn—O-based oxide has sufficiently high resistance when there is no electric field and off-state current can be sufficiently reduced. Further, with high field-effect mobility, the In—Ga—Zn—O-based oxide is suitable for a semiconductor material used in a memory device or a semiconductor device.

Alternatively, a material represented by a chemical formula, $InMO_3(ZnO)_m$ (m>0) may be used as an oxide semiconductor. Here, M represents one or more metal elements selected from Ga, Al, Mn, or Co. For example, M can be Ga, Ga and Al, Ga and Fe, Ga and Ni, Ga and Mn, Ga and Co, or the like. As the oxide semiconductor, a material represented by $In_3SnO_5(ZnO)_n$ (n>0, where n is an integer) may be used. Note that the above compositions are derived from the crystal structures and are only examples.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios is preferably used.

However, without limitation to the materials given above, a material with an appropriate composition may be used in accordance with needed semiconductor characteristics (e.g., mobility, threshold voltage, and variation). In order to obtain needed semiconductor characteristics, it is preferable that carrier density, impurity concentration, defect density, an atomic ratio between a metal element and oxygen, interatomic distance, density, and the like be set to appropriate values.

The transistor whose off-state current is low is used as a switching element for storing electrical charge accumulated in a memory element, whereby leakage of electrical charge from the memory element can be prevented. Thus, it is possible to provide a memory device capable of retaining data for a long time and a semiconductor device including the memory device.

Further, voltage needed for writing and reading data to and from a memory element is almost determined by the operating voltage of the transistor which functions as a switching element. Thus, it is possible to provide a memory device in which operating voltage can be greatly lowered compared to that of a conventional flash memory and power consumption can be reduced, and a semiconductor device including the memory device.

Further, it is possible to provide a memory device in which the frequency of rewrite of data can be increased and a semiconductor device including the memory device because deterioration of a gate insulating film by tunnel current can be suppressed compared to that in a conventional flash memory.

BRIEF DESCRIPTION OF DRAWINGS

In the accompanying drawings:

FIGS. 10A to 10D illustrate the method for manufacturing a memory device;

BEST MODE FOR CARRYING OUT THE INVENTION

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that the present invention includes, in its category, all the semiconductor devices in which memory devices can be used: for example, integrated circuits such as microprocessors and image processing circuits, RF tags, storage media, and semiconductor display devices. Further, the semiconductor display devices include, in its category, semiconductor display devices in which circuit elements using semiconductor films are included in pixel portions or driver circuits, such as liquid crystal display devices, light-emitting devices in which a light-emitting element typified by an organic light-emitting element (OLED) is provided for each pixel, electronic paper, digital micromirror devices (DMD), plasma display panels (PDP), and field emission displays (FED).

(Embodiment 1)

Figure 1A:
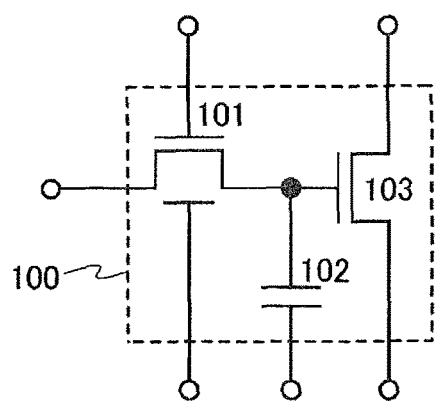
FIGS. 1A and 1B are circuit diagrams of a memory cell.

FIG. 1A illustrates a structure example of a memory cell in a memory device according to one embodiment of the present invention by a circuit diagram. In the circuit diagram illustrated in FIG. 1A, a memory cell 100 includes a transistor 101 functioning as a switching element, and a transistor 103 and a capacitor 102 functioning as memory elements. In the transistor 103 functioning as a memory element, electrical charge is accumulated in gate capacitance formed between a gate electrode and an active layer, so that data is stored.

The transistor 101 which functions as a switching element includes a second gate electrode for controlling the threshold voltage in addition to a first gate electrode.

Specifically, the transistor 101 includes the first gate electrode, the second gate electrode, a semiconductor film positioned between the first gate electrode and the second gate electrode, a first insulating film positioned between the first gate electrode and the semiconductor film, a second insulating film positioned between the second gate electrode and the semiconductor film, and a source electrode and a drain electrode connected to the semiconductor film. With potentials applied to the first gate electrode, the second gate electrode, the source electrode, and the drain electrode of the transistor 101, a variety of operation of the memory device can be controlled.

Note that the memory cell 100 may further include another circuit element such as a transistor, a diode, a resistor, a capacitor, or an inductor when needed.

The terms "source electrode" and "drain electrode" of a transistor interchange with each other depending on the polarity of the transistor or a difference between levels of potentials applied to the electrodes. In general, in an n-channel transistor, an electrode to which a low potential is applied is called a source electrode, and an electrode to which a high potential is applied is called a drain electrode. Further, in a p-channel transistor, an electrode to which a low potential is applied is called a drain electrode, and an electrode to which a high potential is applied is called a source electrode. Hereinafter, one of a source electrode and a drain electrode is referred to as a first terminal and the other is referred to as a second terminal, and a connection relationship of the transistor 101, the capacitor 102, and the transistor 103 included in the memory cell 100 is described.

In the memory cell 100 illustrated in FIG. 1A, a node connected to a first terminal of the transistor 101 is supplied with a potential of a signal including data. Further, a second terminal of the transistor 101 is connected to a gate electrode of the transistor 103. One of a pair of electrodes of the capacitor 102 is connected to the gate electrode of the transistor 103, and the other is connected to a node to which a predetermined potential is applied.

The transistor 103 may be either an n-channel transistor or a p-channel transistor.

Note that the memory cell 100 illustrated in FIG. 1A does not necessarily include the capacitor 102 as its component. When the memory cell 100 includes the capacitor 102, the retention time can be made longer. In contrast, when the memory cell 100 does not include the capacitor 102, storage capacity per unit area can be increased.

Figure 1B:
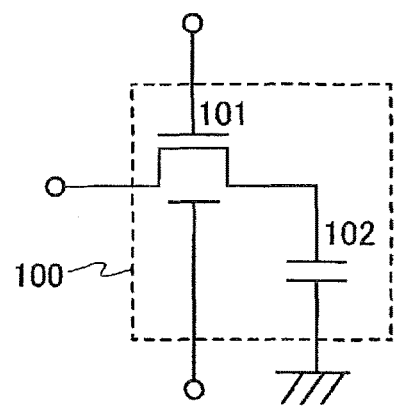

FIG. 1B illustrates a structure example of a memory cell that is different from the structure in FIG. 1A by a circuit diagram. In the circuit diagram illustrated in FIG. 1B, the memory cell 100 includes the transistor 101 functioning as a switching element and the capacitor 102 functioning as a memory element. Electrical charge is accumulated in the capacitor 102 functioning as a memory element, so that data is stored.

The transistor 101 illustrated in FIG. 1B has a structure that is similar to the structure of the transistor 101 illustrated in FIG. 1A, and includes a second gate electrode for controlling the threshold voltage in addition to a first gate electrode.

In the memory cell 100 illustrated in FIG. 1B, a node connected to the first terminal of the transistor 101 is supplied with a potential of a signal including data. Further, one of the pair of electrodes of the capacitor 102 is connected to the second terminal of the transistor 101, and the other is connected to a node to which a predetermined potential is applied.

Note that in this specification, the term "connection" means electrical connection and corresponds to a state in which current, voltage, or a potential can be supplied or transmitted. Accordingly, a connection state does not always mean a direct connection state but includes an indirect connection state through an element such as a wiring, a conductive film, a resistor, a diode, or a transistor so that current, voltage, or a potential can be supplied or transmitted.

In addition, even when independent components are connected to each other in a circuit diagram, there is the case where one conductive film has functions of a plurality of components, such as the case where part of a wiring functions as an electrode. The term "connection" in this specification also means such a case where one conductive film has functions of a plurality of components.

In one embodiment of the present invention, a channel formation region of the transistor 101 functioning as a switching element that is illustrated in FIG. 1A or FIG. 1B includes a semiconductor material whose band gap is wider than that of silicon and whose intrinsic carrier density is lower than that of silicon. With a channel formation region including a semiconductor material having the above characteristics, the transistor 101 whose off-state current is extremely low can be realized.

Note that when the amount of electrical charge accumulated in a memory element is controlled as in one embodiment of the present invention, in the case of a memory device for storing data, the supply of electrical charge to the memory element, the release of electrical charge from the memory element, and the storage of electrical charge in the memory element are controlled by the transistor 101 functioning as a switching element. Thus, the length of a data retention time depends on the amount of leakage of electrical charge accumulated in the memory element through the transistor 101. In one embodiment of the present invention, the off-state current of the transistor 101 can be extremely low as described above. Thus, the electrical charge can be prevented from leaking, so that the data retention time can be made longer.

Note that unless otherwise specified, in this specification, in the case of an n-channel transistor, off-state current is current which flows between a source electrode and a drain electrode when a potential of the drain electrode is higher than that of the source electrode or that of a gate electrode while the potential of the gate electrode is 0 V or lower when a reference potential is the potential of the source electrode. Alternatively, in this specification, in the case of a p-channel transistor, off-state current is current which flows between a source electrode and a drain electrode when a potential of the drain electrode is lower than that of the source electrode or that of a gate electrode while the potential of the gate electrode is 0 V or higher when a reference potential is the potential of the source electrode.

As an example of a semiconductor material whose band gap is wider than that of silicon and whose intrinsic carrier density is lower than that of silicon, a compound semiconductor such as silicon carbide (SiC) or gallium nitride (GaN) as well as an oxide semiconductor can be used. The oxide semiconductor has an advantage of high mass productivity because the oxide semiconductor can be formed by sputtering or a wet process, unlike a compound semiconductor such as silicon carbide or gallium nitride. Further, unlike silicon carbide or gallium nitride, the oxide semiconductor can be deposited even at room temperature; thus, deposition over a glass substrate or deposition over an integrated circuit using silicon is possible. Furthermore, a larger substrate can be used. Thus, with the oxide semiconductor, mass productivity is higher than that in the case of silicon carbide, gallium nitride, or the like. In the case where a crystalline oxide semiconductor is to be obtained in order to improve the performance of a transistor (e.g., field-effect mobility), the crystalline oxide semiconductor can be easily obtained by heat treatment at 250 to 800° C.

In the following description, the case where an oxide semiconductor with the above advantages is used as the semiconductor film of the transistor 101 is given as an example.

Note that in one embodiment of the present invention, a wide-gap semiconductor material such as an oxide semiconductor may be included at least in an active layer of the transistor 101 which functions as a switching element. On the other hand, for an active layer of the transistor 103 which functions as a memory element, an oxide semiconductor may be used or the following semiconductor other than the oxide semiconductor may be used: amorphous silicon, microcrystalline silicon, polycrystalline silicon, single crystal silicon, amorphous germanium, microcrystalline germanium, polycrystalline germanium, single crystal germanium, and the like. When oxide semiconductor films are used for active layers of all the transistors in the memory cell 100, a process can be simplified. Further, for example, the active layer of the transistor 103 functioning as a memory element is formed using a semiconductor material such as polycrystalline silicon or single crystal silicon that has higher mobility than an oxide semiconductor, whereby data can be read from the memory cell 100 at high speed.

Note that although in FIG. 1B, the memory cell 100 includes one transistor 103 functioning as a switching element, the present invention is not limited to this structure. In one embodiment of the present invention, it is acceptable as long as one transistor which functions as a switching element is provided in each memory cell, and the number of such transistors may be plural. In the case where the memory cell 100 includes a plurality of transistors which function as switching elements, the plurality of transistors may be connected in parallel, in series, or in combination of parallel connection and series connection.

Note that in this specification, a state in which transistors are connected in series means, for example, a state in which only one of a first terminal and a second terminal of a first transistor is connected to only one of a first terminal and a second terminal of a second transistor. Further, a state in which transistors are connected in parallel means a state in which a first terminal of a first transistor is connected to a first terminal of a second transistor and a second terminal of the first transistor is connected to a second terminal of the second transistor.

Unlike the transistor 101 which functions as a switching element, the transistor 103 which functions as a memory element may include a gate electrode provided on only one side of the active layer. However, the present invention is not limited to this structure, and the transistor 103 which functions as a memory element may include a pair of gate electrodes with an active layer provided therebetween in a manner similar to that of the transistor 101 which functions as a switching element.

Figure 1C:
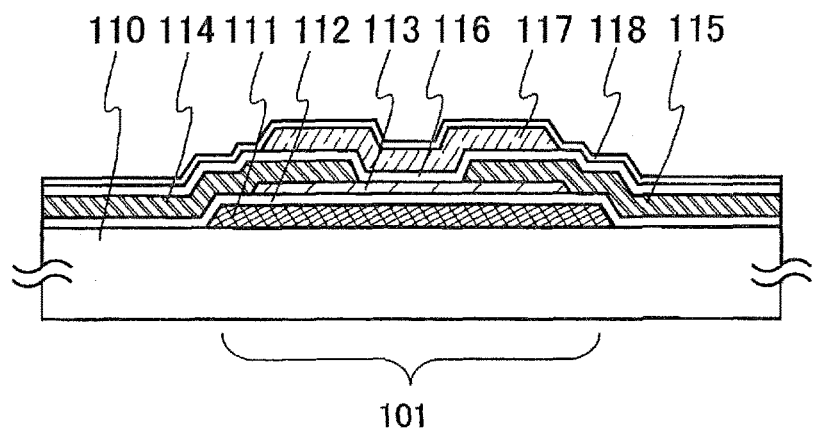
FIG. 1C is a cross-sectional view of a transistor.

Next, an example of a cross-sectional view of the transistor 101 in FIG. 1A and FIG. 1B is illustrated in FIG. 1C.

In FIG. 1C, the transistor 101 includes, over a substrate 110 having an insulating surface, a first gate electrode 111; an insulating film 112 over the first gate electrode 111; an oxide semiconductor film 113 which functions as an active layer and overlaps with the first gate electrode 111 with the insulating film 112 provided therebetween; a source electrode 114 and a drain electrode 115 over the oxide semiconductor film 113; an insulating film 116 over the oxide semiconductor film 113, the source electrode 114, and the drain electrode 115; and a second gate electrode 117 which overlaps with the oxide semiconductor film 113 over the insulating film 116. Further, in FIG. 1C, an insulating film 118 is formed over the second gate electrode 117 and may be included as a component of the transistor 101.

Note that although FIG. 1C illustrate the case where the transistor 101 has a single-gate structure, the transistor 101 may have a multi-gate structure in which a plurality of electrically connected gate electrodes are included so that a plurality of channel formation regions are included.

Figure 2A:
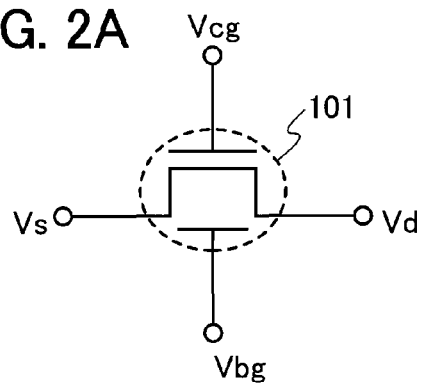
FIG. 2A is a circuit diagram of a transistor.

Next, a change in threshold voltage of the transistor 101 due to a change in potential of the second gate electrode is described. First, FIG. 2A illustrates a circuit diagram of the transistor 101. In FIG. 2A, the potentials of the electrodes of the transistor 101 are represented as follows: the potential of the first gate electrode is represented as Vcg; the potential of the second gate electrode is represented as Vbg; the potential of the source electrode is represented as Vs; and the potential of the drain electrode is represented as Vd.

Figure 2B:
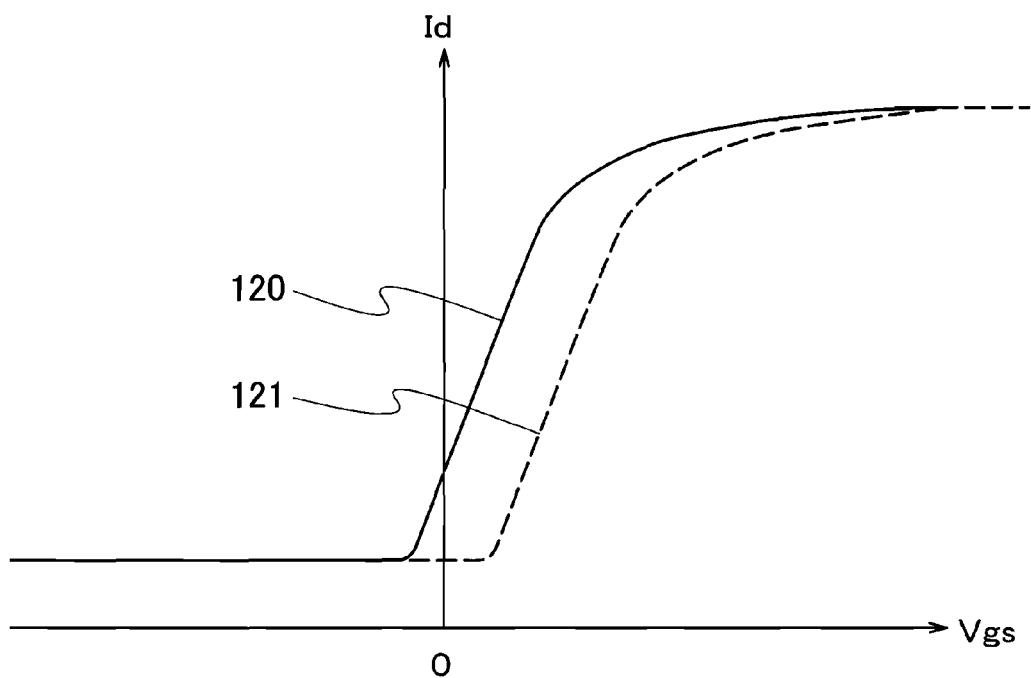
FIG. 2B is a graph showing a value of drain current Id with respect to gate voltage Vgs.

FIG. 2B illustrates the value of drain current Id with respect to gate voltage Vgs. The gate voltage Vgs corresponds to a difference between the potential Vcg of the first gate electrode and the potential Vs of the source electrode when the potential Vs of the source electrode is reference voltage.

A line 120 shown by a solid line represents the value of the drain current Id with respect to the gate voltage Vgs in the case where the potential Vbg of the second gate electrode is at the same level as the potential Vs of the source electrode. In addition, a line 121 shown by a dashed line represents the value of the drain current Id with respect to the gate voltage Vgs in the case where the potential Vbg of the second gate electrode is at a lower level than the potential Vs of the source electrode. Note that the line 120 and the line 121 have the same potential Vs of the source electrode and the same potential Vd of the drain electrode.

As illustrated in FIG. 2B, the threshold voltage of the transistor 101 is shifted positively as the potential Vbg of the second gate electrode becomes lower, so that off-state current is decreased. In contrast, the threshold voltage of the transistor 101 is shifted negatively as the potential Vbg of the second gate electrode becomes higher, so that off-state current is increased, that is, on resistance is decreased.

In one embodiment of the present invention, the length of the data retention time depends on the amount of leakage of electrical charge accumulated in the memory element through the transistor 101 as described above. In one embodiment of the present invention, the off-state current of the transistor 101 can be markedly decreased by control of the potential Vbg of the second gate electrode. Thus, the electrical charge can be prevented from leaking, so that the data retention time can be made longer.

Then, examples of the structure of a memory device including a plurality of memory cells and a method for driving the memory device are described.

Figure 3:
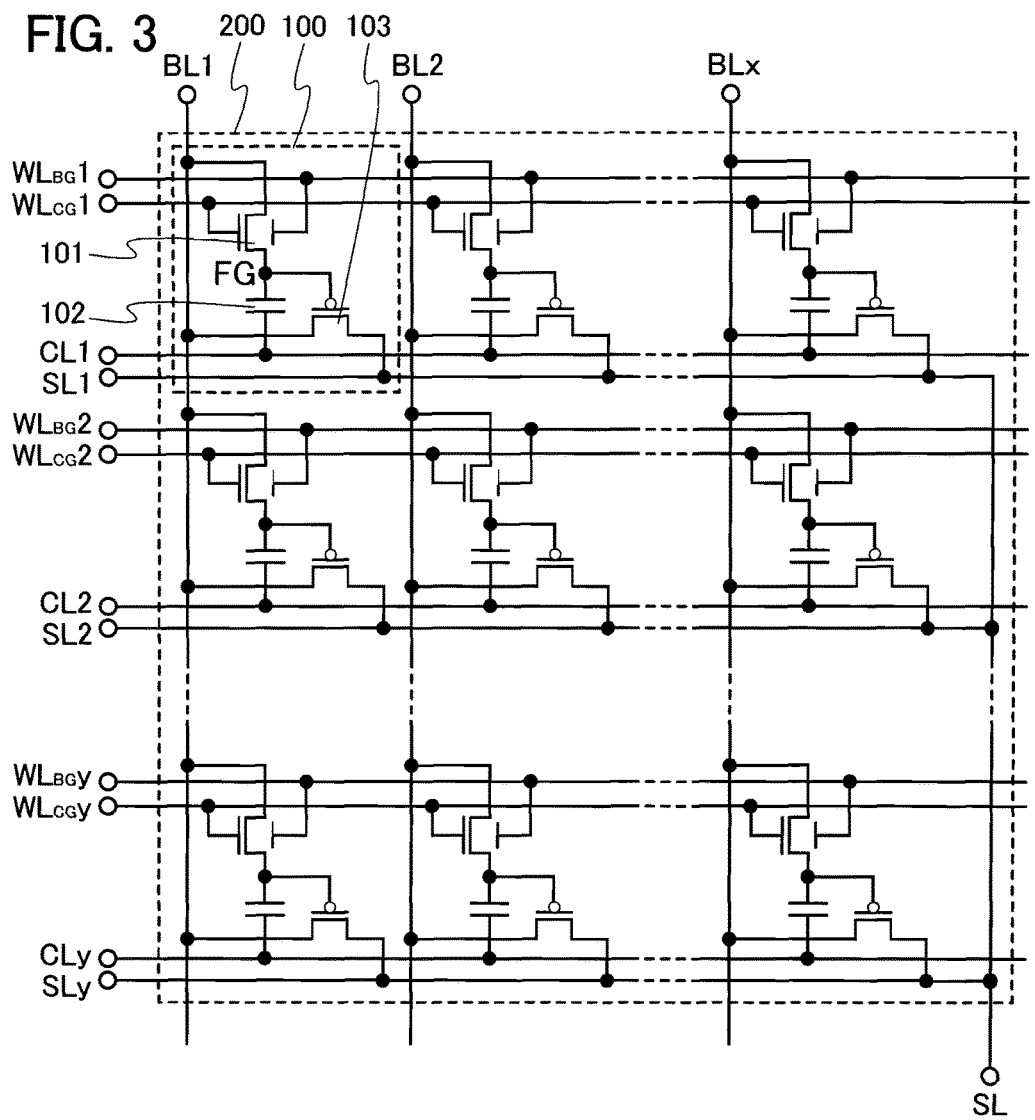
FIG. 3 is a circuit diagram of a cell array.

FIG. 3 is an example of a circuit diagram of a cell array 200 including the plurality of memory cells 100 one of which is illustrated in FIG. 1A. For the structure of the memory cell 100, the description in Embodiment 1 can be referred to.

In the cell array 200 illustrated in FIG. 3, a variety of wirings such as a plurality of first word lines $WL_{CG}$, a plurality of second word lines $WL_{BG}$, a plurality of bit lines BL, a plurality of capacitor lines CL, and a plurality of source lines SL are provided, and a signal or a potential from a driver circuit is supplied to each memory cell 100 through the wirings.

The first word line $WL_{CG}$ is connected to the first gate electrode of the transistor 101. The second word line $WL_{BG}$ is connected to the second gate electrode of the transistor 101. The bit line BL is connected to the first terminal of the transistor 101 and a first terminal of the transistor 103. The source line SL is connected to a second terminal of the transistor 103. The capacitor line CL is connected to one of the pair of electrodes of the capacitor 102 that is not connected to the second terminal of the transistor 101.

Note that the number of the wirings can be determined by the number of the memory cells 100 and arrangement of the memory cells 100. Specifically, in the cell array 200 illustrated in FIG. 3, memory cells are arranged in matrix of y rows by x columns, and first word lines $WL_{CG}1$ to $WL_{CG}y$, second word lines $WL_{BG}1$ to $WL_{BG}y$, capacitor lines CL1 to CLy, source lines SL1 to SLy, and bit lines BL1 to BLx are provided in the cell array 200.

Next, the operation of the cell array 200 illustrated in FIG. 3 is described with reference to a timing chart in FIG. 4. Note that FIG. 4 illustrates the case where data writing, data retention, and data reading are performed on the memory cell in a first row and a first column, the memory cell in the first row and an x-th column, the memory cell in a y-th row and the first column, and the memory cell in the y-th row and the x-th column FIG. 4 illustrates the case where the transistor 103 is a p-channel transistor.

Figure 4:
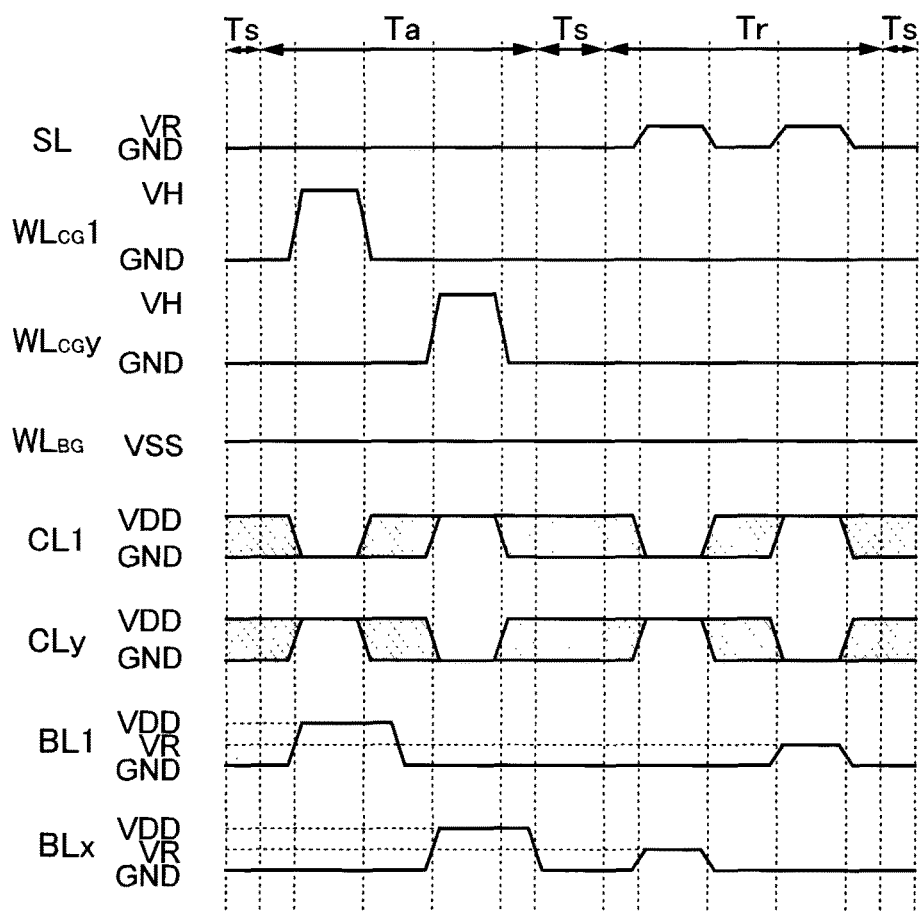
FIG. 4 is a timing chart of the cell array.

Note that the shaded areas in the timing chart in FIG. 4 correspond to periods during which a potential may be either a high potential or a low potential.

First, the operation of the cell array 200 in a data writing period Ta is described.

Data is written row by row. In FIG. 4, data is written to the memory cell in the first row and the first column and the memory cell in the first row and the x-th column, and then, data is written to the memory cell in the y-th row and the first column and the memory cell in the y-th row and the x-th column First, the first word line $WL_{CG}1$ and the capacitor line CL1 in the memory cells in the first row to which data is written are selected. Specifically, in FIG. 4, a high-level potential VH is applied to the first word line $WL_{CG}1$, and a ground potential GND is applied to the first word lines $WL_{CG}2$ to $WL_{CG}y$. Thus, only the transistors 101 whose first gate electrodes are connected to the first word line $WL_{CG}1$ are selectively turned on. The ground potential GND is applied to the capacitor line CL1, and a high-level potential VDD is applied to the capacitor lines CL2 to CLy.

In a period during which the first word line $WL_{CG}1$ and the capacitor line CL1 are selected, potentials of signals including data are applied to the bit lines BL1 and BLx. The levels of the potentials applied to the bit lines BL1 and BLx are naturally different depending on the content of data. FIG. 4 illustrates the case where the high-level potential VDD is applied to the bit line BL1 and the ground potential GND is applied to the bit line BLx. The potentials applied to the bit lines BL1 and BLx are applied to one electrode of the capacitor 102 and the gate electrode of the transistor 103 through the transistors 101 that are on. When a node in which the one electrode of the capacitor 102 and the gate electrode of the transistor 103 are connected to each other is referred to as a node FG, the amount of electrical charge accumulated in the node FG is controlled in accordance with the potentials of the signals, so that data is written to the memory cell in the first row and the first column and the memory cell in the first row and the x-th column.

Then, the ground potential GND is applied to the first word line $WL_{CG}1$, and the transistors 101 whose first gate electrodes are connected to the first word line $WL_{CG}1$ are turned off.

Then, the first word line $WL_{CG}y$ and the capacitor line CLy in the memory cells in the y-th row to which data is written are selected. Specifically, in FIG. 4, the high-level potential VH is applied to the first word line $WL_{CG}y$, and the ground potential GND is applied to the first word lines $WL_{CG}1$ to $WL_{CG}(y-1)$. Thus, only the transistors 101 whose first gate electrodes are connected to the first word line $WL_{CG}y$ are selectively turned on. The ground potential GND is applied to the capacitor line CLy, and the high-level potential VDD is applied to the capacitor lines CL1 to CL(y-1).

In a period during which the first word line $WL_{CG}y$ and the capacitor line CLy are selected, potentials of signals including data are applied to the bit lines BL1 and BLx. FIG. 4 illustrates the case where the ground the potential GND is applied to the bit line BL1 and the high-level potential VDD is applied to the bit line BLx. The potentials applied to the bit lines BL1 and BLx are applied to one electrode of the capacitor 102 and the gate electrode of the transistor 103 through the transistors 101 that are on. The amount of electrical charge accumulated in the node FG is controlled in accordance with the potentials of the signals, so that data is written to the memory cell in the y-th row and the first column and the memory cell in the y-th row and the x-th column.

Note that in the writing period Ta, the ground potential GND is applied to all the source lines SL. With the above structure, in the case where the ground potential GND is applied to the node FG, generation of current in the bit line BL and the source line SL can be suppressed.

In order to prevent writing of erroneous data to the memory cell, it is preferable to terminate a period during which the potential of the signal including data is input to the bit line BL after a selection period of the first word line $WL_{CG}$ and the capacitor line CL is terminated.

Then, the operation of the cell array 200 in a data retention period Ts is described.

In the retention period Ts, a potential at which the transistor 101 is turned off, specifically, the ground potential GND is applied to all the first word lines $WL_{CG}$. In one embodiment of the present invention, in the retention period Ts, a low-level potential VSS which is lower than the ground potential GND is applied to all the second word lines $WL_{BG}$. Thus, the threshold voltage of the transistor 101 is shifted positively, so that the off-state current of the transistor 101 is reduced. When the off-state current of the transistor 101 is low, the electrical charge accumulated in the node FG is less likely to leak; thus, data can be retained for a long time.

Then, the operation of the cell array 200 in a data reading period Tr is described.

First, the capacitor line CL1 in the memory cells in the first row from which data is read is selected. Specifically, in FIG. 4, the ground potential GND is applied to the capacitor line CL1, and the high-level potential VDD is applied to the capacitor lines CL2 to CLy. In the reading period Tr, all the first word lines $WL_{CG}$ are not selected by application of the ground potential GND. In a period during which the capacitor line CL1 is selected, a high-level potential VR is applied to all the source lines SL. Note that the potential VR is equal to the potential VDD, or lower than the potential VDD and higher than the ground potential GND.

Resistance between the source electrode and the drain electrode of the transistor 103 depends on the amount of electrical charge accumulated in the node FG. Thus, a potential based on the amount of electrical charge accumulated in the node FG is applied to the bit lines BL1 and BLx. Then, by reading a difference in the amount of electrical charge from the potential, data can be read from the memory cell in the first row and the first column and the memory cell in the first row and the x-th column.

Then, the capacitor line CLy in the memory cells in the y-th row from which data is read is selected. Specifically, in FIG. 4, the ground potential GND is applied to the capacitor line CLy, and the high-level potential VDD is applied to the capacitor lines CL2 to CL(y-1). As described above, in the reading period Tr, all the first word lines $WL_{CG}$ are not selected by application of the ground potential GND. In a period during which the capacitor line CLy is selected, the high-level potential VR is applied to all the source lines SL.

The resistance between the source electrode and the drain electrode of the transistor 103 depends on the amount of electrical charge accumulated in the node FG. Thus, a potential based on the amount of electrical charge accumulated in the node FG is applied to the bit lines BL1 and BLx. Then, by reading a difference in the amount of electrical charge from the potential, data can be read from the memory cell in the y-th row and the first column and the memory cell in the y-th row and the x-th column.

Note that a reading circuit is connected to an end of each bit line BL, and a signal output from the reading circuit includes data which is actually read from the cell array.

In FIG. 4, through all the writing period Ta, the retention period Ts, and the reading period Tr, the low-level potential VSS is applied to all the second word lines $WL_{BG}$. However, in one embodiment of the present invention, at least in the retention period Ts, the low-level potential VSS may be applied to the second word line $WL_{BG}$. For example, in order to write data to the memory cell at higher speed, in the row to which data is written, the potential of the second word line $WL_{BG}$ may be higher than the potential VSS and the threshold voltage of the transistor 101 may be lowered.

Figure 5:
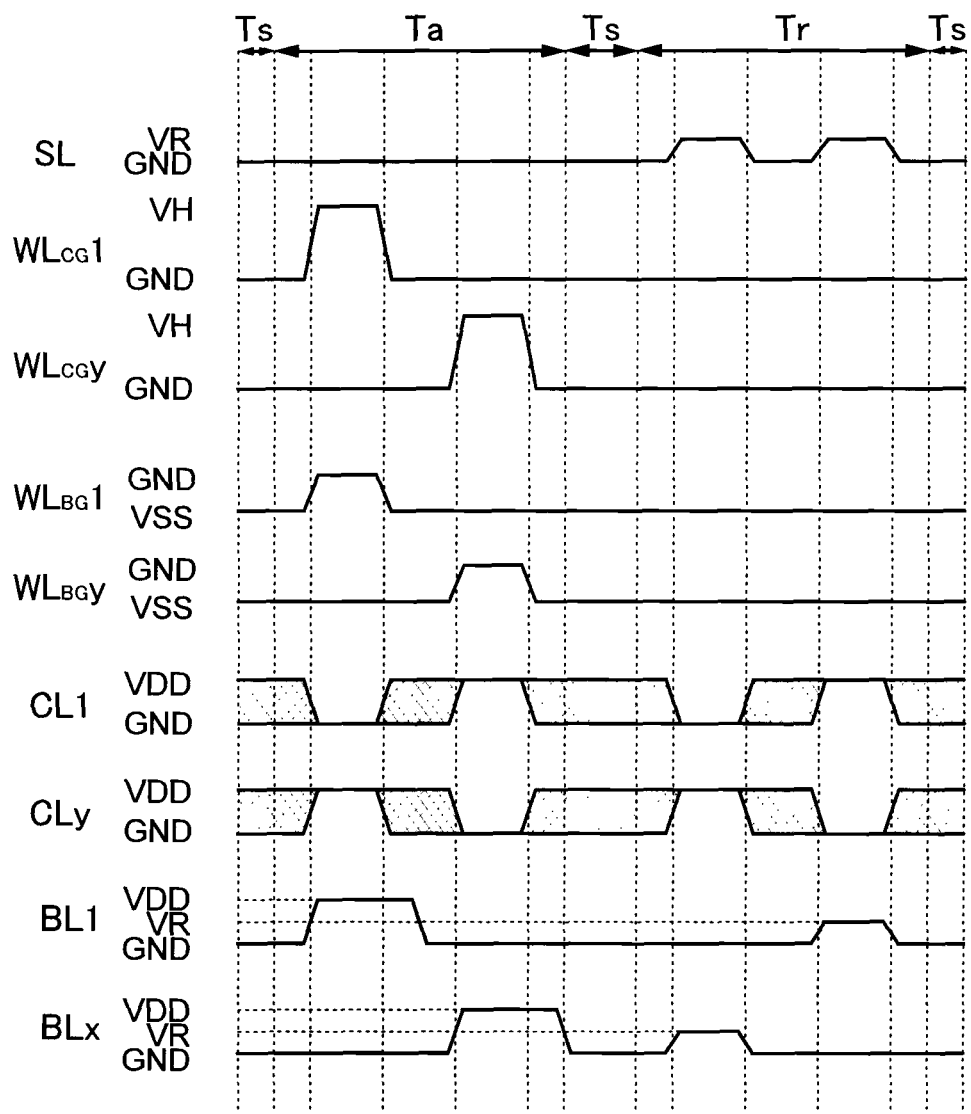
FIG. 5 is a timing chart of the cell array.

In the timing chart illustrated in FIG. 5, the potential of the second word line $WL_{BG}$ in the writing period Ta differs from that in the timing chart illustrated in FIG. 4. Specifically, in FIG. 5, in the writing period Ta, in a period during which the first word line $WL_{CG}1$ is selected, the ground potential GND is applied to the second word line $WL_{BG}1$ in the memory cell in the row to which data is written. In addition, in a period during which the first word line $WL_{CG}y$ is selected, the ground potential GND is applied to the second word line $WL_{BG}y$ in the memory cell in the y-th row to which data is written. With the above structure, in a period during which data is written, the threshold voltage of the transistor 101 can be lowered; thus, data can be written to the memory cell at higher speed in the writing period Ta while leakage of electrical charge in the retention period Ts is suppressed.

Then, different examples of the structure of a memory device including a plurality of memory cells and a method for driving the memory device are described.

Figure 6:
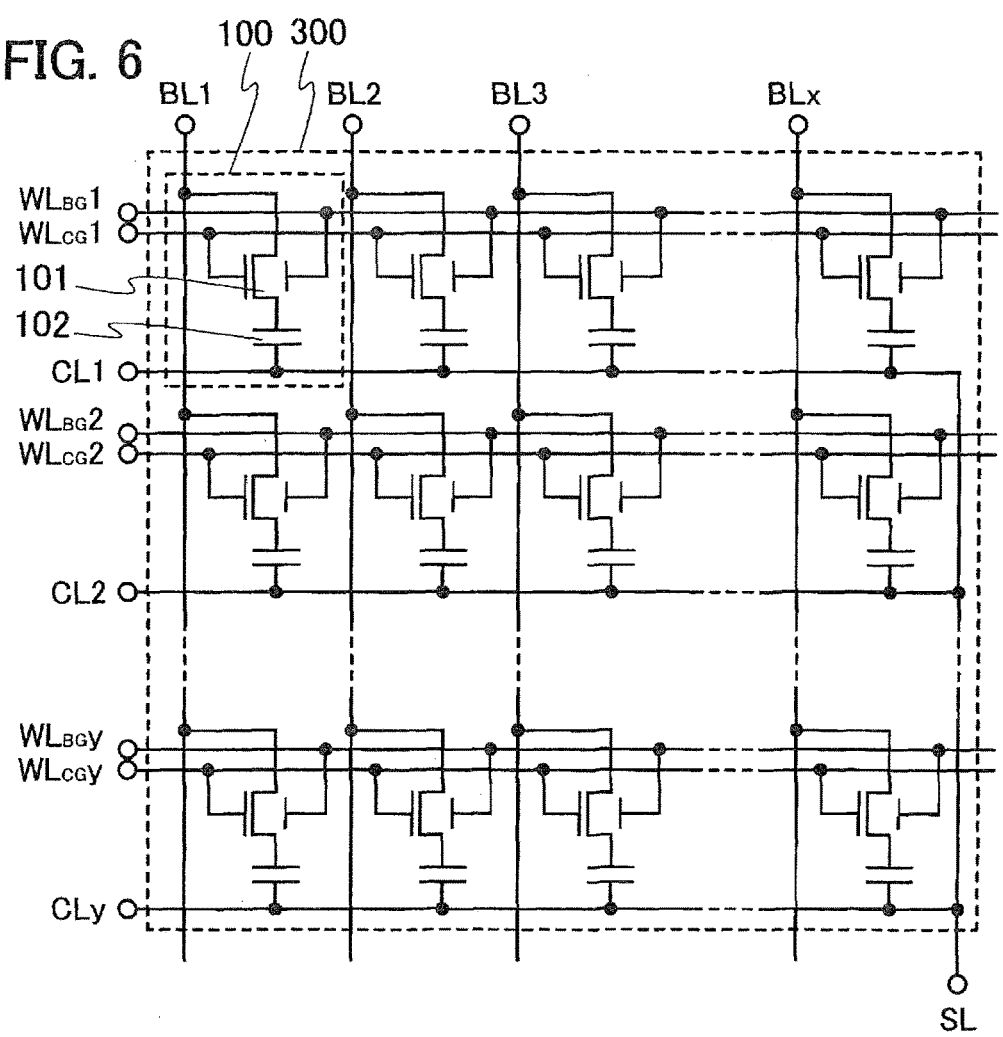
FIG. 6 is a circuit diagram of a cell array.

FIG. 6 is an example of a circuit diagram of a cell array 300 including the plurality of memory cells 100 one of which is illustrated in FIG. 1B. For the structure of the memory cell 100, the description in Embodiment 1 can be referred to.

In the cell array 300 illustrated in FIG. 6, a variety of wirings such as the plurality of first word lines $WL_{CG}$, the plurality of second word lines $WL_{BG}$, the plurality of bit lines BL, and the plurality of capacitor lines CL are provided, and a signal or a potential from a driver circuit is supplied to each memory cell 100 through the wirings.

The first word line $WL_{CG}$ is connected to the first gate electrode of the transistor 101. The second word line $WL_{BG}$ is connected to the second gate electrode of the transistor 101. The bit line BL is connected to the first terminal of the transistor 101. The capacitor line CL is connected to one of the pair of electrodes of the capacitor 102 that is not connected to the second terminal of the transistor 101.

Note that the number of the wirings can be determined by the number of the memory cells 100 and arrangement of the memory cells 100. Specifically, in the cell array 300 illustrated in FIG. 6, memory cells are arranged in matrix of y rows by x columns, and the first word lines $WL_{CG}1$ to $WL_{GG}y$, the second word lines $WL_{BG}1$ to $WL_{BG}y$, the capacitor lines CL1 to CLy, and the bit lines BL1 to BLx are provided in the cell array 300.

Next, the operation of the cell array 300 illustrated in FIG. 6 is described.

First, the operation of the cell array 300 in a data writing period is described. In the data writing period, when a signal with a pulse is input to the first word line $WL_{CG}1$, the potential of the pulse, specifically, a high-level potential is applied to the first gate electrodes of the transistors 101 that are connected to the first word line $WL_{CG}1$. Thus, the transistors 101 whose first gate electrodes are connected to the first word line $WL_{CG}1$ are turned on.

Then, signals including data are input to the bit lines BL1 to BLx. The levels of the potentials of the signals input to the bit lines BL1 and BLx are naturally different depending on the content of data. Potentials input to the bit lines BL1 to BLx are applied to one electrode of the capacitor 102 through the transistors 101 that are on. A fixed potential is applied to all the capacitor lines CL. The amount of electrical charge accumulated in the capacitor 102 is controlled in accordance with the potentials of the signals, so that data is written to the capacitor 102.

When the input of a signal with a pulse to the first word line $WL_{CG}1$ is terminated, the transistors 101 whose first gate electrodes are connected to the first word line $WL_{CG}1$ are turned off. Then, signals with pulses are sequentially input to the first word lines $WL_{CG}2$ to $WL_{CG}y$, and the above operation is similarly repeated in the memory cells 100 with the first word lines $WL_{CG}2$ to $WL_{CG}y$.

Then, the operation of the cell array 300 in a data retention period is described. In the retention period, a potential at which the transistor 101 is turned off, specifically, a low-level potential is applied to all the first word lines $WL_{CG}1$ to $WL_{CG}y$. In one embodiment of the present invention, in the retention period, the low-level potential TOSS is applied to all the second word lines $WL_{BG}$. Thus, the threshold voltage of the transistor 101 is shifted positively, so that the off-state current of the transistor 101 is reduced. When the off-state current of the transistor 101 is low, the electrical charge accumulated in the capacitor 102 is less likely to leak; thus, data can be retained for a long time.

Then, the operation of the cell array 300 in a data reading period is described. In the data reading period, signals with pulses are sequentially input to the first word lines $WL_{CG}1$ to $WL_{CG}y$ in a manner similar to that in the data writing period. When the potential of the pulse, specifically, a high-level potential is applied to the first gate electrodes of the transistors 101 that are connected to the first word line $WL_{CG}1$, the transistors 101 are turned on.

When each transistor 101 is turned on, the electrical charge accumulated in the capacitor 102 is taken out through the bit line BL. By reading a difference in the amount of electrical charge from the potential of the bit line BL, data can be read.

Note that the reading circuit is connected to the end of each bit line BL, and a signal output from the reading circuit includes data which is actually read from a memory portion.

Although a driving method in which data writing, data retention, and data reading are sequentially performed in the plurality of memory cells 100 is described in this embodiment, the present invention is not limited to this. Only the memory cell 100 with a specified address may perform the above operation.

In a manner similar to that in the timing chart illustrated in FIG. 5, in order to write data to the memory cell at higher speed, in the row to which data is written, the potential of the second word line $WL_{BG}$ may be higher than the potential VSS and the threshold voltage of the transistor 101 may be lowered.

Note that the memory device according to one embodiment of the present invention is not limited to the structures of the memory cell 100 illustrated in FIG. 3 and FIG. 6.

Figure 8A:
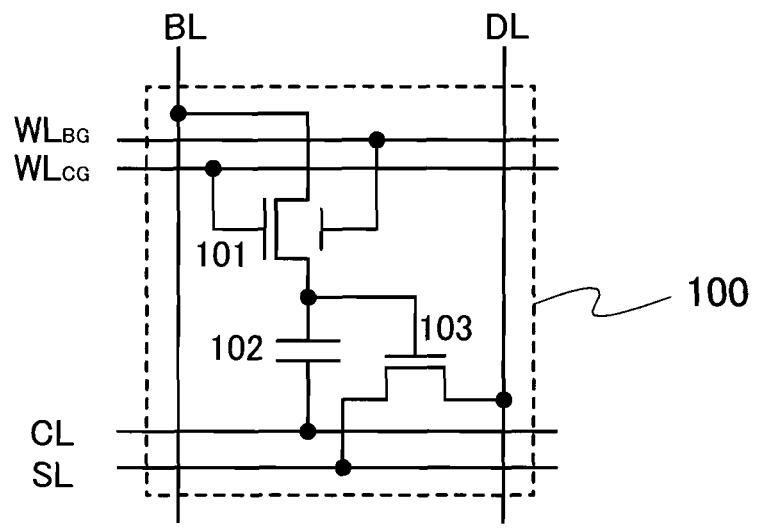
FIGS. 8A and 8B are circuit diagrams of a memory cell.

FIG. 8A illustrates a different structure of the memory cell 100. The memory cell 100 illustrated in FIG. 8A includes the transistor 101, the capacitor 102, and the transistor 103. The first gate electrode of the transistor 101 is connected to the first word line $WL_{CG}$. The second gate electrode of the transistor 101 is connected to the second word line $WL_{BG}$. The first terminal of the transistor 101 is connected to the bit line BL. The second terminal of the transistor 101 is connected to the gate electrode of the transistor 103. The first terminal of the transistor 103 is connected to the data line DL. The second terminal of the transistor 103 is connected to the source line SL. One of the pair of electrodes of the capacitor 102 is connected to the gate electrode of the transistor 103, and the other is connected to the capacitor line CL.

In the case of the memory cell 100 illustrated in FIG. 8A, the amount of electrical charge accumulated in the capacitor 102 and the transistor 103 functioning as memory elements can be read from the potential of the data line DL.

Figure 8B:
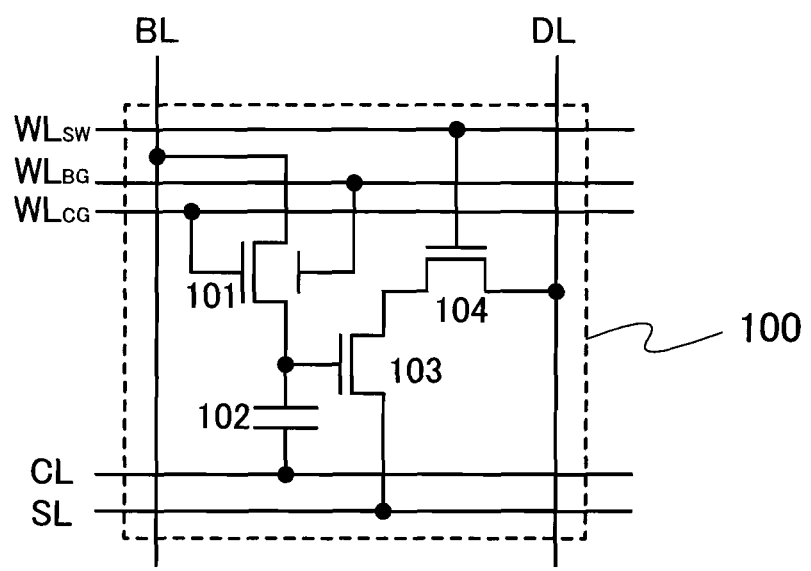

FIG. 8B illustrates a different structure of the memory cell 100. The memory cell 100 illustrated in FIG. 8B includes a transistor 104 which functions as a switching element for controlling data reading, in addition to the transistor 101, the capacitor 102, and the transistor 103. The first gate electrode of the transistor 101 is connected to the first word line $WL_{CG}$. The second gate electrode of the transistor 101 is connected to the second word line $WL_{BG}$. The first terminal of the transistor 101 is connected to the bit line BL. The second terminal of the transistor 101 is connected to the gate electrode of the transistor 103. The first terminal of the transistor 103 is connected to a second terminal of the transistor 104. The second terminal of the transistor 103 is connected to the source line SL. A first terminal of the transistor 104 is connected to the data line DL. A gate electrode of the transistor 104 is connected to a third word line $WL_{SW}$. One of the pair of electrodes of the capacitor 102 is connected to the gate electrode of the transistor 103, and the other is connected to the capacitor line CL.

In the case of the memory cell 100 illustrated in FIG. 8B, the transistor 104 is turned on by a change in potential of the third word line $WL_{SW}$ at the time of reading data. Then, the amount of electrical charge accumulated in the capacitor 102 and the transistor 103 functioning as memory elements can be read from the potential of the data line DL.

In the memory device according to one embodiment of the present invention, different data can be written so that data which has been written is overwritten. Thus, unlike a conventional flash memory, the memory device has an advantage that erasing of data which has been written is not needed at the time of rewriting data.

In the case of a general flash memory, a floating gate in which electrical charge is accumulated is covered with an insulating film and in an insulating state. Accordingly, it is necessary to apply a high voltage of approximately 20 V to a memory element in order that electrical charge is accumulated in the floating gate with the use of a tunnel effect. However, in one embodiment of the present invention, data can be written and read by a transistor including a highly-purified oxide semiconductor film as an active layer. Thus, a voltage of several volts is needed for operation of the memory device, so that power consumption can be markedly decreased.

Note that in a semiconductor device including a general flash memory, since voltage needed for operation (operating voltage) of the flash memory is high, voltage applied to the flash memory is usually raised by a step-up circuit (a step-up DC-DC converter) or the like. However, since the operating voltage of the memory device can be lowered in the memory device according to one embodiment of the present invention, it is possible to reduce power consumption. Accordingly, the load of an external circuit used for operation of the memory device, such as a step-up circuit, in a semiconductor device can be decreased, so that the function of the external circuit is expanded, and the higher performance of the semiconductor device can be realized.

Further, although a driving method at the time when binary digital data is used is described in this embodiment, the memory device of the present invention can use multi-valued data that has three or more values. Note that in the case of multivalued data that has three or more values, a difference between the amounts of electrical charge becomes smaller as the number of values is increased to four, five, and six, for example. Thus, if a slight amount of off-state current exists, it is difficult to maintain the accuracy of data, and a retention period tends to be shorter. However, in one embodiment of the present invention, since the transistor whose off-state current is markedly reduced is used as a switching element, shortening of a retention period due to value multiplexing can be suppressed.

Figure 7:
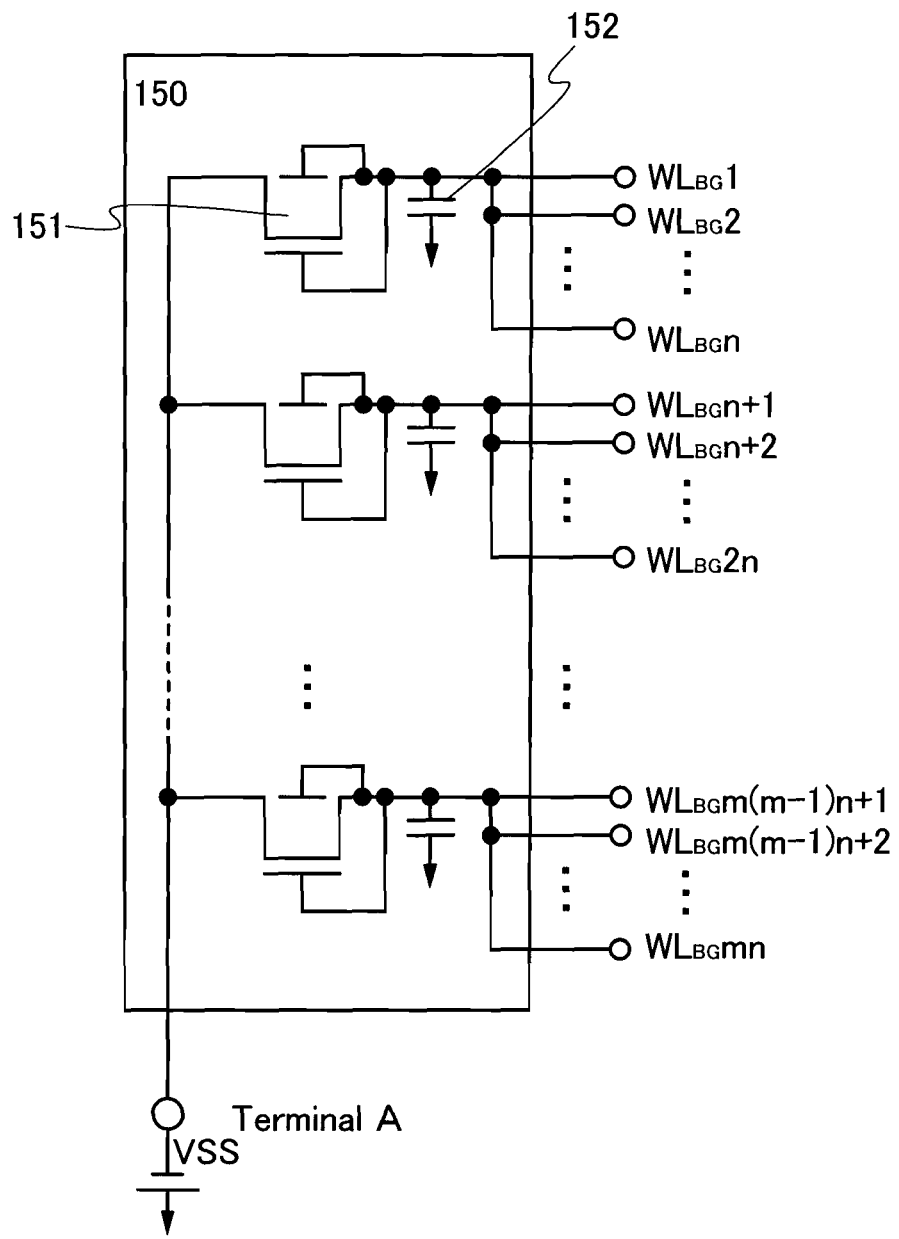
FIG. 7 illustrates a structure of a second word line driver circuit.

Next, an example of the structure of a second word line driver circuit for controlling the potential of the second word line $WL_{BG}$ is described. FIG. 7 is an example of a circuit diagram of a second word line driver circuit 150.

The second word line driver circuit 150 illustrated in FIG. 7 includes a transistor 151 functioning as a diode (a driver circuit transistor) and a capacitor 152 (a driver circuit capacitor). The potential TOSS is supplied to a first terminal of the transistor 151 through a terminal A. A first gate electrode and a second gate electrode of the transistor 151 are connected to a second terminal of the transistor 151. The capacitor 152 includes a pair of electrodes. One of the pair of electrodes of the capacitor 152 is connected to the second terminal of the transistor 151. A predetermined potential is applied to the other of the pair of electrodes of the capacitor 152. The second terminal of the transistor 151 is connected to the second word line $WL_{BG}$.

Specifically, in FIG. 7, the second word line driver circuit 150 includes m sets (m is a natural number of 2 or more) of the transistor 151 and the capacitor 152. In addition, n (n is a natural number of 1 or more) second word lines $WL_{BG}$ are connected to the second terminal of one transistor 151.

In the case where the potential of the second word line $WL_{BG}$ is higher than the potential VSS, current flows from the second word line $WL_{BG}$ to the terminal A through the transistor 151. Thus, the potential of the second word line $WL_{BG}$ is set to a potential which is higher than the potential VSS by the threshold voltage of the transistor 151. If this potential can be set so as to be much lower than the potential of the source electrode of the transistor 101 in the memory cell 100, the threshold voltage of the transistor 101 is shifted positively; thus, the off-state current of the transistor 101 is reduced. Accordingly, the retention characteristics of the memory device can be improved.

Note that in the case where the supply of the potential VSS to the second word line driver circuit 150 is stopped and the potential of the terminal A is higher than the potential of the second word line $WL_{BG}$, reverse biased voltage is applied to the transistor 151, so that only off-state current flows through the transistor 151. Electricity is stored in the capacitor 152 by this off-state current, and the potential of the second word line $WL_{BG}$ increases over time. Finally, a potential difference between the source electrode and the second gate electrode of the transistor 101 is made small, so that it is impossible to shift the threshold voltage of the transistor 101 so that the off-state current can be sufficiently reduced. However, since the capacitor 152 can be provided outside the cell array, larger capacitance can be secured as compared to the capacitor 102 provided in the memory cell. Thus, when the capacitance of the capacitor 152 is, for example, 100 times the capacitance of the capacitor 102 provided in the memory cell, the time the potential of the second word line $WL_{BG}$ takes to reach the upper limit can be extended 100 times. Accordingly, when a period during which the supply of the potential VSS is stopped is short, loss of data stored in the memory device can be prevented.

Note that the transistor 151 does not necessarily include the second gate electrode. However, it is preferable that the transistor 151 include the second gate electrode and that the second gate electrode be connected to the second terminal of the transistor 151 as illustrated in FIG. 7 for the following reason. With the above structure, when forward bias voltage is applied to the transistor 151 functioning as a diode, on-state current is increased because the threshold voltage of the transistor 151 is lowered. Thus, capability of supplying current to the second word line $WL_{BG}$ can be improved. Further, with the above structure, when reverse biased voltage is applied to the transistor 151, off-state current is decreased because the threshold voltage of the transistor 151 is raised. Thus, the time the potential of the second word line $WL_{BG}$ takes to reach the upper limit can be extended.

FIG. 7 also illustrates the structure of the second word line driver circuit 150 at the time when the fixed potential VSS is supplied to the second word line $WL_{BG}$ as illustrated in the timing chart in FIG. 4. In the case where the potential VSS and the ground potential GND are supplied to the second word line $WL_{BG}$ in a writing period as illustrated in the timing chart in FIG. 5, the terminal A is connected not to a DC power source but to a signal source in FIG. 7.

(Embodiment 2)

In this embodiment, a method for manufacturing the memory device which includes the transistor 101 including an oxide semiconductor and the transistor 103 including silicon is described.

As well as silicon, a semiconductor material such as germanium, silicon germanium, or single crystal silicon carbide may be used for the transistor 103. For example, the transistor 103 including silicon can be formed using a single crystal semiconductor substrate such as a silicon wafer, a silicon thin film which is formed by an SOI method, a silicon thin film which is formed by vapor deposition, or the like. Alternatively, in one embodiment of the present invention, all the transistors included in the memory cells may include an oxide semiconductor.

Figure 9A:
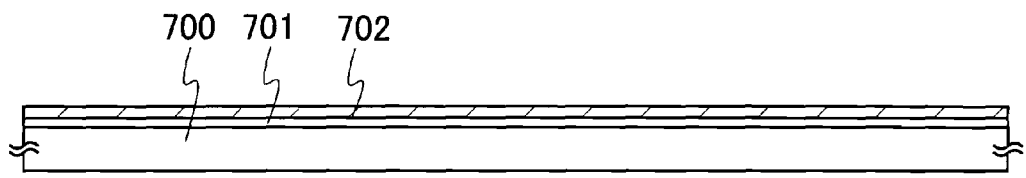
FIGS. 9A to 9D illustrate a method for manufacturing a memory device.

In this embodiment, first, as illustrated in FIG. 9A, an insulating film 701 and an island-shaped semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where the temperature of the heat treatment to be performed later is high, a glass substrate whose strain point is 730° C. or higher is preferably used as a glass substrate.

In this embodiment, an example in which the semiconductor film 702 is formed using single crystal silicon is given as a method for forming the transistor 103. Note that a specific example of a method for forming the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately 1 to 500 N/cm², preferably 11 to 20 N/cm² is applied to part of the bond substrate and part of the substrate 700 so that the substrates are attached to each other. When the pressure is applied to part of the bond substrate and part of the substrate 700, bonding between the bond substrate and the insulating film 701 starts from the parts, which results in bonding of the entire surface where the bond substrate and the insulating film 701 are in close contact with each other. After that, heat treatment is performed, so that microvoids that exist in the fragile layer expand, and the microvoids are combined with each other. Accordingly, a single crystal semiconductor film which is part of the bond substrate is separated from the bond substrate along the fragile layer. The temperature of the heat treatment is set so as not to exceed the strain point of the substrate 700. Then, the single crystal semiconductor film is processed into a desired shape by etching or the like, so that the island-shaped semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not patterned or may be added to the patterned semiconductor film 702. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not patterned or the patterned semiconductor film 702 in order to finely control the threshold voltage.

Note that although an example in which a single crystal semiconductor film is used is described in this embodiment, the present invention is not limited to this structure. For example, a polycrystalline, microcrystalline, or amorphous semiconductor film which is formed over the insulating film 701 by vapor deposition may be used. Alternatively, the semiconductor film may be crystallized by a known technique. As a known crystallization technique, laser crystallization using a laser beam or crystallization using a catalytic element can be used. Alternatively, crystallization using a catalytic element and laser crystallization can be used in combination. When a heat-resistant substrate such as a quartz substrate is used, crystallization combined with thermal crystallization using an electrically heated oven, lamp annealing crystallization using infrared light, crystallization using a catalytic element, or high-temperature annealing at approximately 950° C. may be used.

Figure 9B:
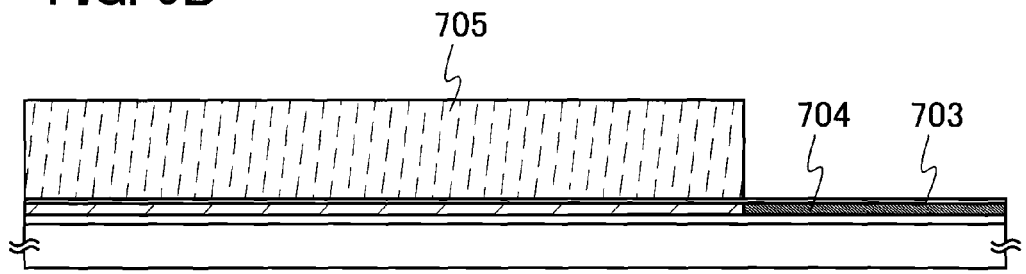

Next, as illustrated in FIG. 9B, a gate insulating film 703 is formed over the semiconductor film 702. Then, a mask 705 is formed over the gate insulating film 703 and an impurity element imparting conductivity is added to part of the semiconductor film 702, so that an impurity region 704 is formed.

The gate insulating film 703 can be formed by oxidation or nitriding of a surface of the semiconductor film 702 by high-density plasma treatment, heat treatment, or the like. The high-density plasma treatment is performed using, for example, a mixed gas of a rare gas such as He, Ar, Kr, or Xe; and oxygen, nitrogen oxide, ammonia, nitrogen, hydrogen, or the like. In that case, when plasma is excited by introduction of microwaves, plasma with a low electron temperature and high density can be generated. By oxidation or nitriding of the surface of the semiconductor film with oxygen radicals (including OH radicals in some cases) or nitrogen radicals (including NH radicals in some cases) generated by such high-density plasma, an insulating film with a thickness of 1 to 20 nm, preferably 5 to 10 nm can be formed so as to be in contact with the semiconductor film. For example, nitrous oxide ($N_2O$) is diluted with Ar by 1 to 3 times (flow rate) and a microwave (2.45 GHz) electric power of 3 to 5 kW is applied with a pressure of 10 to 30 Pa so that the oxidation or nitriding of the surface of the semiconductor film 702 is performed. By this treatment, an insulating film with a thickness of 1 to 10 nm (preferably 2 to 6 nm) is formed. Further, nitrous oxide ($N_2O$) and silane ($SiH_4$) are introduced and a microwave (2.45 GHz) electric power of 3 to 5 kW is applied with a pressure of 10 to 30 Pa so that a silicon oxynitride film is formed by vapor deposition, thereby forming a gate insulating film. With a combination of solid-phase reaction and vapor deposition, a gate insulating film having low interface state density and high withstand voltage can be formed.

The oxidation or nitriding of the semiconductor film by the high-density plasma treatment proceeds by solid-phase reaction. Thus, interface state density between the gate insulating film 703 and the semiconductor film 702 can be extremely low. Further, by direct oxidation or nitriding of the semiconductor film 702 by high-density plasma treatment, variation in the thickness of the insulating film to be formed can be suppressed. Further, in the case where the semiconductor film has crystallinity, by oxidation of the surface of the semiconductor film by solid-phase reaction by high-density plasma treatment, crystal grain boundaries can be prevented from being locally oxidized at fast speed. Thus, a uniform gate insulating film with low interface state density can be formed. Variations in the characteristics of a transistor whose gate insulating film partly or entirely includes an insulating film formed by high-density plasma treatment can be suppressed.

The gate insulating film 703 may be formed using a single layer or a stack of layers of a film including silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$, (x>0, y>0)) to which nitrogen is added, hafnium aluminate ($HfAl_xO_y$, (x>0, y>0)) to which nitrogen is added, or the like by plasma-enhanced CVD, sputtering, or the like.

Note that in this specification, an oxynitride is a substance which includes more oxygen than nitrogen, and a nitride oxide is a substance which includes more nitrogen than oxygen.

The thickness of the gate insulating film 703 can be, for example, 1 to 100 nm, preferably 10 to 50 nm. In this embodiment, a single-layer insulating film containing silicon oxide is formed as the gate insulating film 703 by plasma-enhanced CVD.

Figure 9C:
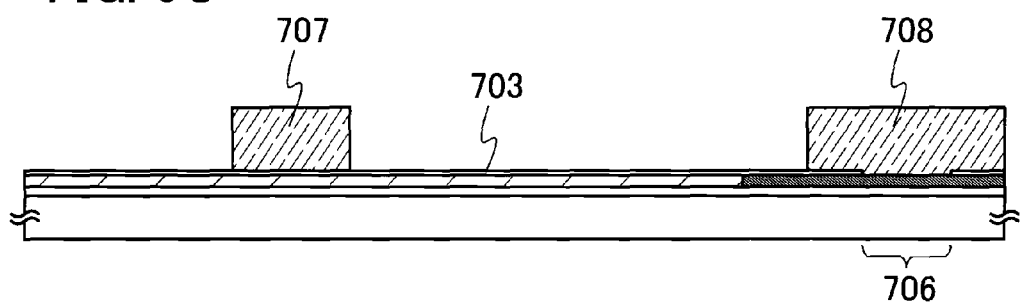

Then, after the mask 705 is removed, part of the gate insulating film 703 is removed as illustrated in FIG. 9C and an opening 706 is formed in a region overlapping with the impurity region 704 by etching or the like. After that, a gate electrode 707 and a conductive film 708 are formed.

A conductive film is formed so as to cover the opening 706 and then is processed (patterned) into a predetermined shape, so that the gate electrode 707 and the conductive film 708 can be formed. The conductive film 708 is in contact with the impurity region 704 in the opening 706. The conductive film can be formed by CVD, sputtering, vapor deposition, spin coating, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing the metal as its main component or a compound containing the metal may be used. Alternatively, the conductive film may be formed using a semiconductor such as polycrystalline silicon doped with an impurity element such as phosphorus which imparts conductivity to the semiconductor film.

Note that although the gate electrode 707 and the conductive film 708 are formed using a single-layer conductive film in this embodiment, this embodiment is not limited to this structure. The gate electrode 707 and the conductive film 708 may be formed of a plurality of stacked conductive films.

As a combination of two conductive films, tantalum nitride or tantalum can be used for a first conductive film and tungsten can be used for a second conductive film. As well as the example, any of the following combination can be used: tungsten nitride and tungsten; molybdenum nitride and molybdenum; aluminum and tantalum; aluminum and titanium; and the like. Since tungsten and tantalum nitride have high heat resistance, heat treatment for thermal activation can be performed in a step performed after the two conductive films are formed. Alternatively, as the combination of the two conductive films, for example, nickel silicide and silicon doped with an impurity element which imparts n-type conductivity, tungsten silicide and silicon doped with an impurity element which imparts n-type conductivity, or the like can be used.

In the case of a three-layer structure in which three or more conductive films are stacked, a layered structure of a molybdenum film, an aluminum film, and a molybdenum film is preferably used.

A light-transmitting oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like can be used as the gate electrode 707 and the conductive film 708.

Alternatively, the gate electrode 707 and the conductive film 708 may be selectively formed by a droplet discharge method without the use of a mask. A droplet discharge method is a method for forming a predetermined pattern by discharge or ejection of a droplet containing a predetermined composition from an orifice, and includes an inkjet method in its category.

In addition, the gate electrode 707 and the conductive film 708 may be formed by forming a conductive film, and the conductive film is etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to have a desired tapered shape. Further, an angle and the like of the tapered shape may be controlled by the shape of a mask. Note that for an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 9D:
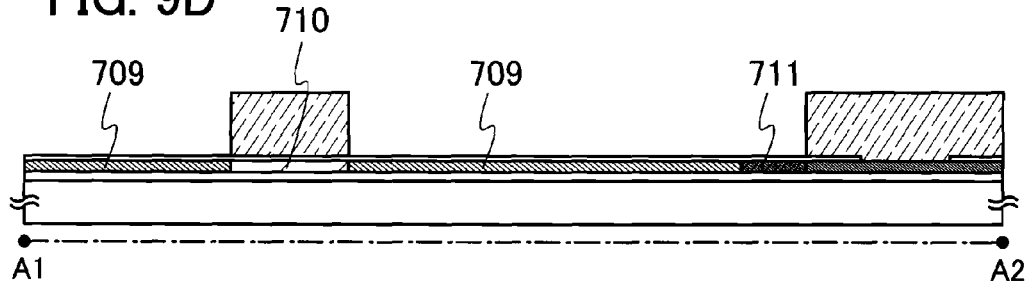

Next, as illustrated in FIG. 9D, when an impurity element which impart one conductivity is added to the semiconductor film 702 with the gate electrode 707 and the conductive film 708 used as masks, a channel formation region 710 overlapping with the gate electrode 707, a pair of impurity regions 709 sandwiching the channel formation region 710, and an impurity region 711 obtained by further adding an impurity element to part of the impurity region 704 are formed in the semiconductor film 702.

In this embodiment, the case where an impurity element which imparts p-type conductivity (e.g., boron) is added to the semiconductor film 702 is described.

Figure 12A:
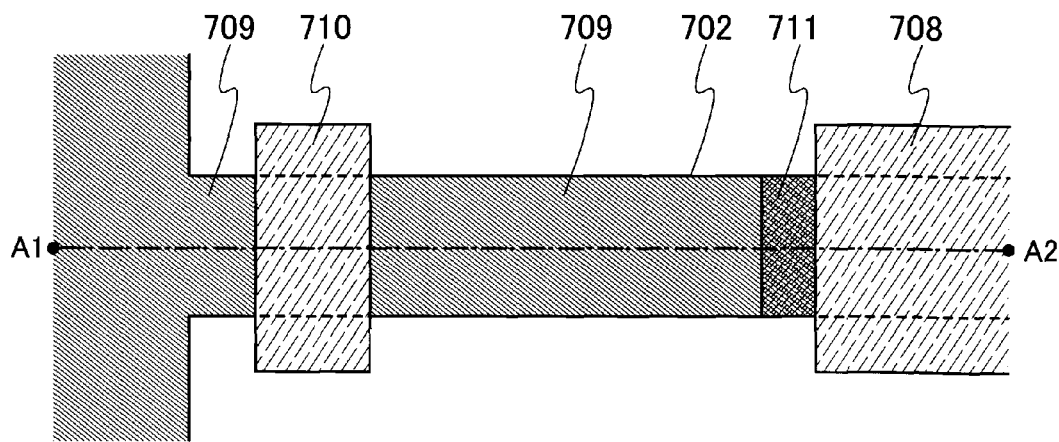
FIGS. 12A to 12C illustrate the method for manufacturing a memory device.

Note that FIG. 12A is a top view of the memory cell at the time when the above steps are finished. A cross-sectional view taken along dashed line A1-A2 in FIG. 12A corresponds to FIG. 9D.

Next, as illustrated in FIG. 10A, insulating films 712 and 713 are formed so as to cover the gate insulating film 703, the gate electrode 707, and the conductive film 708. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using a low dielectric constant (low-k) material because capacitance due to overlapping of electrodes or wirings can be sufficiently reduced. Note that a porous insulating film including such a material may be employed as the insulating films 712 and 713. Since the porous insulating film has lower dielectric constant than a dense insulating layer, parasitic capacitance due to electrodes or wirings can be further reduced.

In this embodiment, an example in which silicon oxynitride is used for the insulating film 712 and silicon nitride oxide is used for the insulating film 713 is described. In addition, in this embodiment, although an example in which the insulating films 712 and 713 are formed over the gate electrode 707 and the conductive film 708, in the present invention, only one insulating film may be formed over the gate electrode 707 and the conductive film 708, or a plurality of insulating films of three or more layers may be stacked.

Next, as illustrated in FIG. 10B, the insulating films 712 and 713 are subjected to CMP (chemical mechanical polishing) or etching, so that surfaces of the gate electrode 707 and the conductive film 708 are exposed. Note that in order to improve the characteristics of the transistor 101 which is formed later, surfaces of the insulating films 712 and 713 are preferably flattened as much as possible.

Through the above steps, the transistor 103 can be formed.

Next, a method for forming the transistor 101 is described. First, as illustrated in FIG. 10C, a gate electrode 714 is formed over the insulating film 712 or the insulating film 713. The gate electrode 714 can be formed using a material and a layered structure which are similar to those of the gate electrode 707 and the conductive film 708.

The thickness of the gate electrode 714 is 10 to 400 nm, preferably 100 to 200 nm. In this embodiment, after a 150-nm-thick conductive film for the gate electrode is formed by sputtering using a tungsten target, the conductive film is processed (patterned) into a desired shape by etching, so that the gate electrode 714 is formed. Note that when end portions of the formed gate electrode are tapered, coverage with a gate insulating film stacked thereover is improved, which is preferable. A resist mask may be formed by an inkjet method. When the resist mask is formed by an inkjet method, a photomask is not used; thus, manufacturing cost can be reduced.

Next, as illustrated in FIG. 10D, a gate insulating film 715 is formed over the gate electrode 714, and then, an island-shaped oxide semiconductor film 716 is formed over the gate insulating film 715 so as to overlap with the gate electrode 714.

The gate insulating film 715 can be formed using a material and a layered structure which are similar to those of the gate insulating film 703. Note that it is preferable that the gate insulating film 715 contains impurities such as moisture or hydrogen as little as possible. In the case where a silicon oxide film is formed by sputtering, a silicon target or a quartz target is used as a target, and oxygen or a mixed gas of oxygen and argon is used as a sputtering gas.

An oxide semiconductor which is highly purified by removal of an impurity and reduction of oxygen deficiency is highly sensitive to an interface state and interface electrical charge; thus, characteristics of an interface between the highly-purified oxide semiconductor film 716 and the gate insulating film 715 are important. Thus, the gate insulating film 715 which is in contact with the highly-purified oxide semiconductor film 716 needs high quality.

For example, high-density plasma-enhanced CVD using microwaves (a frequency of 2.45 GHz) is preferable because a dense high-quality insulating film having high withstand voltage can be formed. This is because when the highly purified oxide semiconductor is closely in contact with the high-quality gate insulating film, the interface state can be reduced and interface properties can be favorable.

Needless to say, a different deposition method such as sputtering or plasma-enhanced CVD can be used as long as a high-quality insulating film can be formed as the gate insulating film 715. In addition, any insulating film can be used as long as film quality and properties of an interface with an oxide semiconductor of the insulating film are modified by heat treatment performed after deposition. In either case, any insulating film can be used as long as film quality as a gate insulating film is high, interface state density with an oxide semiconductor is decreased, and a favorable interface can be formed.

The gate insulating film 715 may have a structure in which an insulating film formed using a material having a high barrier property and an insulating film having low proportion of nitrogen, such as a silicon oxide film or a silicon oxynitride film, are stacked. In that case, the insulating film such as a silicon oxide film or a silicon oxynitride film is formed between the insulating film having a high barrier property and the oxide semiconductor film 716. As the insulating film having a high barrier property, a silicon nitride film, a silicon nitride oxide film, an aluminum nitride film, aluminum oxide film, an aluminum nitride oxide film, or the like can be used, for example. The insulating film having a high barrier property can prevent impurities in an atmosphere, such as moisture or hydrogen, or impurities in the substrate, such as an alkali metal or a heavy metal, from entering the oxide semiconductor film 716, the gate insulating film 715, or the interface between the oxide semiconductor film 716 and another insulating film and the vicinity thereof. In addition, the insulating film having low proportion of nitrogen, such as a silicon oxide film or a silicon oxynitride film, is formed so as to be in contact with the oxide semiconductor film 716, so that the insulating film having a high barrier property can be prevented from being in direct contact with the oxide semiconductor film 716.

For example, the 100-nm-thick gate insulating film 715 may be formed in such a manner that a silicon nitride film ($SiN_y$, (y>0)) with a thickness of 50 to 200 nm is formed as a first gate insulating film by sputtering and a silicon oxide film ($SiO_x$ (x>0)) with a thickness of 5 to 300 nm is stacked as a second gate insulating film over the first gate insulating film. The thickness of the gate insulating film 715 may be set as appropriate depending on characteristics needed for the transistor and may be approximately 350 to 400 nm.

In this embodiment, the gate insulating film 715 with a structure in which a 100-nm-thick silicon oxide film formed by sputtering is stacked over a 50-nm-thick silicon nitride film formed by sputtering is formed.

Note that the gate insulating film 715 is in contact with the oxide semiconductor film 716 which is formed later. When hydrogen is contained in the oxide semiconductor film 716, characteristics of the transistor are adversely affected; thus, it is preferable that the gate insulating film 715 do not contain hydrogen, a hydroxyl group, and moisture. In order that hydrogen, a hydroxyl group, and moisture be contained in the gate insulating film 715 as little as possible, it is preferable that an impurity such as hydrogen or moisture that is adsorbed on the substrate 700 be eliminated and exhausted by preheating of the substrate 700 over which the gate electrode 714 is formed in a preheating chamber of a sputtering apparatus, as pretreatment for deposition. The temperature of the preheating is 100 to 400° C., preferably 150 to 300° C. As an exhaustion means provided in the preheating chamber, a cryopump is preferable. Note that the preheating treatment can be omitted.

The island-shaped oxide semiconductor film 716 can be formed by processing an oxide semiconductor film formed over the gate insulating film 715 into a desired shape. The thickness of the oxide semiconductor film is 2 to 200 nm, preferably 3 to 50 nm, more preferably 3 to 20 nm. The oxide semiconductor film is deposited by sputtering using an oxide semiconductor as a target. Alternatively, the oxide semiconductor film can be formed by sputtering in a rare gas (e.g., argon) atmosphere, an oxygen atmosphere, or a mixed atmosphere of a rare gas (e.g., argon) and oxygen.

Note that before the oxide semiconductor film is deposited by sputtering, dust on a surface of the gate insulating film 715 is preferably removed by reverse sputtering in which an argon gas is introduced and plasma is generated. The reverse sputtering is a method in which, without application of voltage to a target side, an RF power source is used for application of voltage to a substrate side in an argon atmosphere and plasma is generated in the vicinity of the substrate so that a substrate surface is modified. Note that nitrogen, helium, or the like may be used instead of the argon atmosphere. Alternatively, an argon atmosphere to which oxygen, nitrous oxide, or the like is added may be used. Alternatively, an argon atmosphere to which chlorine, carbon tetrafluoride, or the like is added may be used.

As described above, for the oxide semiconductor film, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

In this embodiment, as the oxide semiconductor film, a 30-nm-thick In—Ga—Zn-based oxide semiconductor thin film which is obtained by sputtering using a target including indium (In), gallium (Ga), and zinc (Zn) is used. In the case where an In—Ga—Zn-based oxide semiconductor film is formed by sputtering, it is preferable to use a target of an In—Ga—Zn-based oxide with an atomic ratio of In:Ga:Zn=1:1:1, 4:2:3, 3:1:2, 1:1:2, 2:1:3, or 3:1:4. When an oxide semiconductor film is formed using a target of an In—Ga—Zn-based oxide having the above atomic ratio, a polycrystal or a c-axis-aligned crystal (CAAC) is likely to be formed. The filling rate of the target including In, Ga, and Zn is higher than or equal to 90% and lower than or equal to 100%, preferably higher than or equal to 95% and lower than 100%. With the use of the target with a high filling rate, a dense oxide semiconductor film is formed.

In the case where an In—Zn-based material is used for the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, when a target used for deposition of an oxide semiconductor film formed using an In—Zn-based oxide has a composition ratio of In:Zn:O=X:Y:Z in an atomic ratio, where Z>1.5X+Y. The mobility can be improved by keeping the ratio of Zn within the above range.

In this embodiment, the oxide semiconductor film is deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be 100 to 600° C., preferably 200 to 400° C. at the time of deposition. By deposition of the oxide semiconductor film while the substrate is heated, the concentration of impurities included in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A turbo pump to which a cold trap is added may be used as an exhaustion means. For example, a hydrogen atom, a compound containing a hydrogen atom, such as water (preferably a compound containing a carbon atom), and the like are exhausted from the treatment chamber with the use of a cryopump. Thus, the concentration of impurities contained in the oxide semiconductor film deposited in the treatment chamber can be lowered.

As an example of the deposition condition, the following condition is employed: the distance between the substrate and the target is 100 mm, the pressure is 0.6 Pa, the direct current (DC) power is 0.5 kW, and the atmosphere is an oxygen atmosphere (the proportion of the oxygen flow rate is 100%). Note that it is preferable that pulsed direct-current (DC) power be used because dust generated at the time of deposition can be reduced and the film thickness can be uniform.

Note that in order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700 over which the gate insulating film 715 is formed in a preheating chamber of a sputtering apparatus, as pretreatment for deposition. The temperature of the preheating is 100 to 400° C., preferably 150 to 300° C. As an exhaustion means provided in the preheating chamber, a cryopump is preferable. Note that the preheating treatment can be omitted. This preheating may be similarly performed on the substrate 700 over which conductive films 719 and 720 are formed before the formation of a gate insulating film 721.

Note that etching for forming the island-shaped oxide semiconductor film 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching, parallel plate RIE (reactive ion etching) or ICP (inductively coupled plasma) etching can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, organic acid such as citric acid or oxalic acid, or the like can be used. In this embodiment, ITO-07N (produced by KANTO CHEMICAL CO., INC.) is used.

A resist mask for forming the island-shaped oxide semiconductor film 716 may be formed by an inkjet method. When the resist mask is formed by an inkjet method, a photomask is not used; thus, manufacturing cost can be reduced.

Note that it is preferable that reverse sputtering be performed before the formation of a conductive film in a subsequent step so that a resist residue or the like that attaches onto surfaces of the island-shaped oxide semiconductor film 716 and the gate insulating film 715 is removed.

Note that the oxide semiconductor film deposited by sputtering or the like contains a large amount of moisture or hydrogen (including a hydroxyl group) as an impurity in some cases. Moisture or hydrogen easily forms a donor level and thus serve as an impurity in the oxide semiconductor. Thus, in one embodiment of the present invention, in order to reduce impurities such as moisture or hydrogen in the oxide semiconductor film (perform dehydration or dehydrogenation), the island-shaped oxide semiconductor film 716 is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring down laser spectroscopy (CRDS) method).

By performing heat treatment on the island-shaped oxide semiconductor film 716, moisture or hydrogen in the island-shaped oxide semiconductor film 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

In this embodiment, an electric furnace that is one of heat treatment apparatuses is used.

Note that the heat treatment apparatus is not limited to an electric furnace, and may be provided with a device for heating an object by thermal conduction or thermal radiation from a heater such as a resistance heater. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. An inert gas which does not react with an object by heat treatment, such as nitrogen or a rare gas (e.g., argon), is used as the gas.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Note that it has been pointed out that an oxide semiconductor is insensitive to impurities, there is no problem when a considerable amount of metal impurities is contained in the film, and soda-lime glass which contains a large amount of alkali metal such as sodium and is inexpensive can be used (Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633). But such consideration is not appropriate. Alkali metal is not an element included in an oxide semiconductor and thus is an impurity. Alkaline earth metal is also an impurity in the case where alkaline earth metal is not included in an oxide semiconductor. Alkali metal, in particular, Na becomes $Na^+$ when an insulating film which is in contact with an oxide semiconductor film is an oxide and Na diffuses into the insulating film. In addition, in the oxide semiconductor film, Na cuts or enters a bond between metal and oxygen which are included in an oxide semiconductor. As a result, for example, deterioration of characteristics of a transistor, such as a normally-on state of the transistor due to shift of the threshold voltage in a negative direction, or a decrease in mobility, occurs. Variation in characteristics also occurs. Such deterioration of characteristics of the transistor and variation in characteristics due to the impurity remarkably appear when the concentration of hydrogen in the oxide semiconductor film is extremely low. Thus, when the concentration of hydrogen in the oxide semiconductor film is $5\times10^{19}$ cm$^{-3}$ or lower, particularly, $5\times10^{18}$ cm$^{-3}$ or lower, the concentration of the impurity is preferably lowered. Specifically, the measurement value of a Na concentration by secondary ion mass spectrometry is preferably $5\times10^{16}$/cm$^3$ or less, more preferably $1\times10^{16}$/cm$^3$ or less, still more preferably $1\times10^{15}$/cm$^3$ or less. Similarly, the measurement value of a Li concentration is preferably $5\times10^{15}$/cm$^3$ or less, more preferably $1\times10^{15}$/cm$^3$ or less. Similarly, the measurement value of a K concentration is preferably $5\times10^{15}$/cm$^3$ or less, more preferably $1\times10^{15}$/cm$^3$ or less.

Through the above steps, the concentration of hydrogen in the island-shaped oxide semiconductor film 716 can be lowered. In addition, the heat treatment at a temperature of lower than or equal to the glass transition temperature makes it possible to form an oxide semiconductor film with a wide bandgap and low carrier density due to hydrogen. Thus, the transistor can be formed using a large substrate, so that mass productivity can be increased. The heat treatment can be performed at any time after the oxide semiconductor film is deposited.

Note that in the case where the oxide semiconductor film is heated, depending on the material of the oxide semiconductor film or heating conditions, plate-like crystals are formed at the surface of the oxide semiconductor film in some cases. The plate-like crystal is preferably a single crystal which is c-axis-aligned in a direction substantially perpendicular to a surface of the oxide semiconductor film. Even if the plate-like crystals are not single crystal bodies, each crystal is preferably a polycrystalline body which is c-axis-aligned in a direction substantially perpendicular to the surface of the oxide semiconductor film. Further, it is preferable that the polycrystalline bodies be c-axis-aligned and that the a-b planes of crystals correspond, or the a-axes or b-axes of the crystals be aligned with each other. Note that when a base surface of the oxide semiconductor film is uneven, the plate-like crystal is a polycrystal. Thus, the base surface is preferably as even as possible.

Figure 11A:
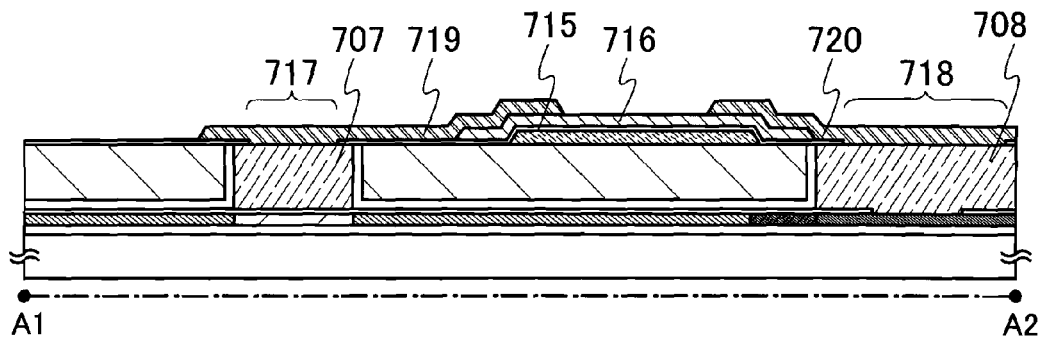
FIGS. 11A to 11C illustrate the method for manufacturing a memory device.

Next, as illustrated in FIG. 11A, part of the gate insulating film 715 is removed so that openings 717 and 718 are formed. Thus, part of the gate electrode 707 and part of the conductive film 708 are exposed. Then, the conductive film 719 which is in contact with the gate electrode 707 through the opening 717 and the oxide semiconductor film 716 and the conductive film 720 which is in contact with the conductive film 708 through the opening 718 and the oxide semiconductor film 716 are formed. The conductive films 719 and 720 function as a source and drain electrodes.

Specifically, the conductive films 719 and 720 can be formed in such a manner that a conductive film is formed so as to cover the openings 717 and 718 by sputtering or vacuum vapor deposition and then is processed (patterned) into a predetermined shape.

As the conductive film which serves as the conductive films 719 and 720, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given.

For the conductive film which serves as the conductive films 719 and 720, a conductive metal oxide may be used. As the conductive metal oxide, indium oxide, tin oxide, zinc oxide, a mixture of indium oxide and tin oxide, a mixture of indium oxide and zinc oxide, or the conductive metal oxide material containing silicon or silicon oxide can be used.

In the case where heat treatment is performed after the formation of the conductive film, the conductive film preferably has heat resistance high enough to withstand the heat treatment.

Note that each material and etching conditions are adjusted as appropriate so that the oxide semiconductor film 716 is not removed as much as possible at the time of etching the conductive film. Depending on the etching conditions, an exposed portion of the island-shaped oxide semiconductor film 716 is partly etched, so that a groove (a depression portion) is formed in some cases.

In this embodiment, a titanium film is used as the conductive film. Thus, the conductive film can be selectively etched by wet etching using a solution (an ammonia hydrogen peroxide mixture) containing ammonia and hydrogen peroxide water; however, the oxide semiconductor film 716 is partly etched in some cases. As the ammonia hydrogen peroxide mixture, specifically, a solution in which oxygenated water of 31 wt %, ammonia water of 28 wt %, and water are mixed at a volume ratio of 5:2:2 is used. Alternatively, dry etching may be performed on the conductive film with the use of a gas containing chlorine (Cl$_2$), boron chloride (BCl$_3$), or the like.

Note that in order to reduce the number of photomasks used in a photolithography process and to reduce the number of processes, an etching process may be performed using a multi-tone mask through which light is transmitted to have a plurality of intensities. A resist mask formed using a multi-tone mask has a plurality of thicknesses and can be changed in shape by etching; thus, the resist mask can be used in a plurality of etching processes for processing films into different patterns. Accordingly, a resist mask corresponding to at least two or more kinds of different patterns can be formed by one multi-tone mask. Thus, the number of exposure masks and the number of corresponding photolithography processes can be reduced, so that the process can be simplified.

Further, an oxide conductive film functioning as a source region and a drain region may be provided between the oxide semiconductor film 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive films 719 and 720 may be performed concurrently.

With provision of the oxide conductive film functioning as a source region and a drain region, resistance between the oxide semiconductor film 716 and the conductive films 719 and 720 can be lowered, so that the transistor can operate at high speed. In addition, with provision of the oxide conductive film functioning as a source region and a drain region, the withstand voltage of the transistor can be increased.

Next, plasma treatment may be performed using a gas such as $N_2O$, $N_2$, or Ar. With this plasma treatment, water and the like which attach to a surface of the oxide semiconductor film exposed are removed. Alternatively, plasma treatment may be performed using a mixture gas of oxygen and argon.

Figure 12B:
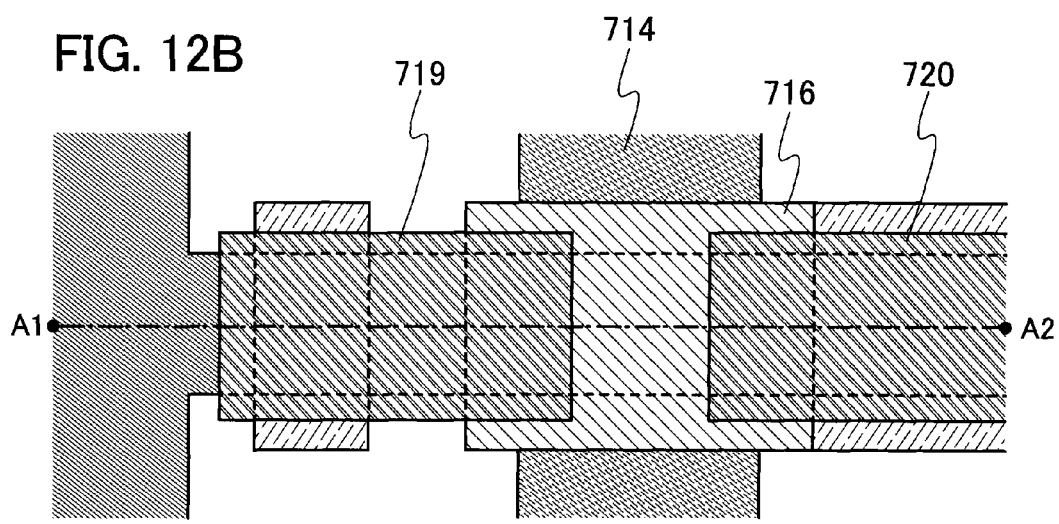

Note that FIG. 12B is a top view of the memory cell at the time when the above steps are finished. A cross-sectional view taken along dashed line A1-A2 in FIG. 12B corresponds to FIG. 11A.

Figure 11B:
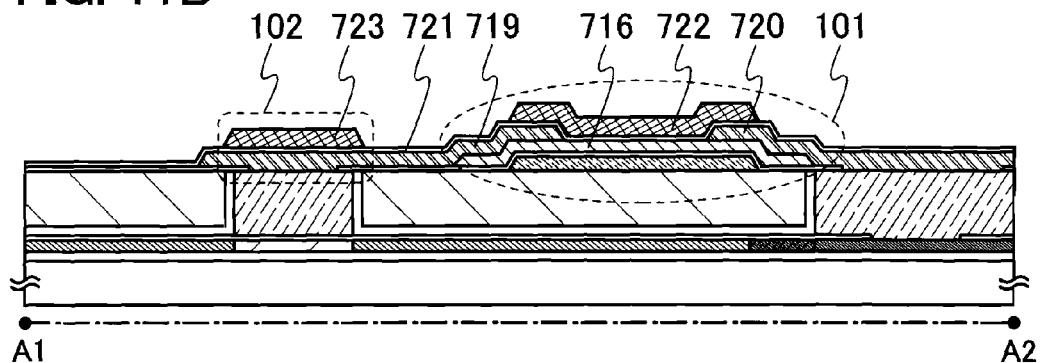

After the plasma treatment, as illustrated in FIG. 11B, the gate insulating film 721 is formed so as to cover the conductive films 719 and 720 and the oxide semiconductor film 716. Then, a gate electrode 722 is formed over the gate insulating film 721 so as to overlap with the oxide semiconductor film 716, and a conductive film 723 is formed over the conductive film 719 so as to overlap with the conductive film 719.

The gate insulating film 721 can be formed using a material and a layered structure which are similar to those of the gate insulating film 703. Note that the gate insulating film 721 preferably includes impurities such as moisture or hydrogen as little as possible, and the gate insulating film 721 may be formed using a single-layer insulating film or a plurality of insulating films stacked. When hydrogen is contained in the gate insulating film 721, hydrogen enters the oxide semiconductor film 716 or oxygen in the oxide semiconductor film 716 is extracted by hydrogen, whereby the oxide semiconductor film 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen such as a silicon oxide film or a silicon oxynitride film is formed on a side which is closer to the oxide semiconductor film 716 than the insulating film having a high barrier property. Then, the insulating film having a high barrier property is formed so as to overlap with the conductive films 719 and 720 and the oxide semiconductor film 716 with the insulating film having low proportion of nitrogen sandwiched therebetween. When the insulating film having a high barrier property is used, impurities such as moisture or hydrogen can be prevented from entering the oxide semiconductor film 716, the gate insulating film 721, or the interface between the oxide semiconductor film 716 and another insulating film and the vicinity thereof. In addition, the insulating film having low proportion of nitrogen, such as a silicon oxide film or a silicon oxynitride film, is formed so as to be in contact with the oxide semiconductor film 716, so that the insulating film having a high barrier property can be prevented from being in direct contact with the oxide semiconductor film 716.

In this embodiment, the gate insulating film 721 with a structure in which a 100-nm-thick silicon nitride film formed by sputtering is stacked over a 200-nm-thick silicon oxide film formed by sputtering is formed. The substrate temperature at the time of deposition is in the range of room temperature to 300° C., and is 100° C. in this embodiment.

After the gate insulating film 721 is formed, heat treatment may be performed. The heat treatment is performed in a nitrogen atmosphere, ultra-dry air, or a rare gas (e.g., argon or helium) atmosphere preferably at 200 to 400° C., for example, 250 to 350° C. It is preferable that the content of water in the gas be 20 ppm or lower, preferably 1 ppm or lower, more preferably 10 ppb or lower. In this embodiment, for example, heat treatment is performed at 250° C. for 1 hour in a nitrogen atmosphere. Alternatively, RTA treatment for a short time at a high temperature may be performed before the formation of the conductive films 719 and 720 in a manner similar to that of the heat treatment performed on the oxide semiconductor film for reduction of moisture or hydrogen. Even when oxygen defects are generated in the oxide semiconductor film 716 by the heat treatment performed on the oxide semiconductor film 716 by performing heat treatment after provision of the gate insulating film 721 containing oxygen, oxygen is supplied to the oxide semiconductor film 716 from the gate insulating film 721. By the supply of oxygen to the oxide semiconductor film 716, oxygen defects that serve as donors can be reduced in the oxide semiconductor film 716 and the stoichiometric ratio can be satisfied. As a result, the oxide semiconductor film 716 can be highly purified so as to be substantially intrinsic and variation in electrical characteristics of the transistor due to oxygen defects can be reduced; thus, electrical characteristics can be improved. The timing of this heat treatment is not particularly limited as long as it is after the formation of the gate insulating film 721. When this heat treatment serves as heat treatment in another step (e.g., heat treatment at the time of formation of a resin film or heat treatment for lowering the resistance of a transparent conductive film), the oxide semiconductor film 716 can be made to be substantially intrinsic without the increase in the number of steps.

Alternatively, the oxygen defects that serve as donors in the oxide semiconductor film 716 may be reduced by subjecting the oxide semiconductor film 716 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably 6N (99.9999%) or higher, more preferably 7N (99.99999%) or higher (that is, the impurity concentration in oxygen is 1 ppm or lower, preferably 0.1 ppm or lower).

Alternatively, oxygen may be added to the oxide semiconductor film 716 by ion implantation, ion doping, or the like so that oxygen defects that serve as donors are reduced.

For example, oxygen made to be plasma with a microwave of 2.45 GHz may be added to the oxide semiconductor film 716.

The gate electrode 722 and the conductive film 723 can be formed in such a manner that a conductive film is formed over the gate insulating film 721 and then is patterned. The gate electrode 722 and the conductive film 723 can be formed using a material and a layered structure which are similar to those of the gate electrode 722 and the conductive films 719 and 720.

The thickness of each of the gate electrode 722 and the conductive film 723 is 10 to 400 nm, preferably 100 to 200 nm. For example, the gate electrode 722 and the conductive film 723 may be formed in such a manner that a conductive film in which a titanium film, an aluminum film, and a titanium film are stacked is formed, a resist mask is formed through photolithography or the like, and unnecessary portions are removed by etching so that the conductive film is processed (patterned) into a desired shape.

Through the above steps, the transistor 101 is formed.

Note that a portion where the conductive film 719 and the conductive film 723 overlap with each other with the gate insulating film 721 provided therebetween corresponds to the capacitor 102.

Figure 12C:
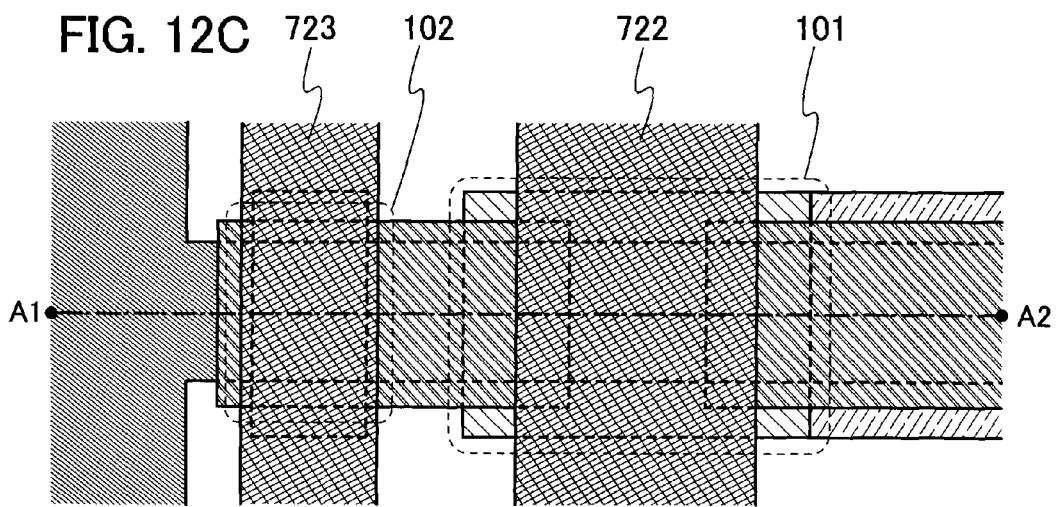

Note that FIG. 12C is a top view of the memory cell at the time when the above steps are finished. A cross-sectional view taken along dashed line A1-A2 in FIG. 12C corresponds to FIG. 11B.

Although the transistor 101 is described as a single-gate transistor, a multi-gate transistor including a plurality of channel formation regions can be formed when the plurality of gate electrodes 714 which are electrically connected are included when needed.

Note that an insulating film which is in contact with the oxide semiconductor film 716 (in this embodiment, corresponding to the gate insulating film 715 and the gate insulating film 721) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating film which is in contact with the oxide semiconductor film, the state of an interface with the oxide semiconductor film can be kept well.

An insulating material containing an element that belongs to Group 13 is an insulating material containing one or more elements that belong to Group 13. Examples of the insulating material containing an element that belongs to Group 13 include gallium oxide, aluminum oxide, aluminum gallium oxide, and gallium aluminum oxide. Here, aluminum gallium oxide is a material whose content of aluminum is larger than the content of gallium in an atomic percent, and gallium aluminum oxide is a material whose content of gallium is larger than or equal to the content of aluminum in an atomic percent.

For example, in the case where an insulating film is formed in contact with an oxide semiconductor film containing gallium, when a material containing gallium oxide is used for the insulating film, favorable characteristics can be kept at the interface between the oxide semiconductor film and the insulating film. For example, when the oxide semiconductor film and the insulating film containing gallium oxide are provided in contact with each other, pileup of hydrogen at the interface between the oxide semiconductor film and the insulating film can be reduced. Note that a similar effect can be obtained in the case where an element that belongs to the same group as a constituent element of the oxide semiconductor is used for the insulating film. For example, it is effective to form an insulating film with the use of a material containing aluminum oxide. Aluminum oxide does not easily transmit water. Thus, it is preferable to use the material including aluminum oxide in order to prevent water from entering the oxide semiconductor film.

The insulating film which is in contact with the oxide semiconductor film 716 preferably contains oxygen in a proportion higher than that in the stoichiometric composition, by heat treatment in an oxygen atmosphere or oxygen doping. Oxygen doping is addition of oxygen to a bulk. Note that the term "bulk" is used in order to clarify that oxygen is added not only to a surface of a thin film but also to the inside of the thin film. In addition, the term "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor film 716 is formed using gallium oxide, the composition of gallium oxide can be set to be $Ga_2O_X$ ($X=3+\alpha$, $0<\alpha<1$) by heat treatment in an oxygen atmosphere or oxygen doping.

In the case where the insulating film which is in contact with the oxide semiconductor film 716 is formed using aluminum oxide, the composition of aluminum oxide can be set to be $Al_2O_X$ ($X=3+\alpha$, $0<\alpha<1$) by heat treatment in an oxygen atmosphere or oxygen doping.

In the case where the insulating film which is in contact with the oxide semiconductor film 716 is formed using gallium aluminum oxide (aluminum gallium oxide), the composition of gallium aluminum oxide (aluminum gallium oxide) can be set to be $Ga_XAl_{2-X}O_{3+a}$ ($0<X<2$, $0<a<1$) by heat treatment in an oxygen atmosphere or oxygen doping.

By oxygen doping, an insulating film including a region where the proportion of oxygen is higher than that in the stoichiometric composition can be formed. When the insulating film including such a region is in contact with the oxide semiconductor film, oxygen that exists excessively in the insulating film is supplied to the oxide semiconductor film, and oxygen deficiency in the oxide semiconductor film or at the interface between the oxide semiconductor film and the insulating film is reduced. Thus, the oxide semiconductor film can be formed to an intrinsic or substantially intrinsic oxide semiconductor.

The insulating film including a region where the proportion of oxygen is higher than that in the stoichiometric composition may be applied to either the insulating film placed on an upper side of the oxide semiconductor film or the insulating film placed on a lower side of the oxide semiconductor film of the insulating films which are in contact with the oxide semiconductor film 716; however, it is preferable to apply such an insulating film to both the insulating films which are in contact with the oxide semiconductor film 716. The above effect can be enhanced with a structure where the oxide semiconductor film 716 is sandwiched between the insulating films each including a region where the proportion of oxygen is higher than that in the stoichiometric composition, which are used as the insulating films in contact with the oxide semiconductor film 716 and positioned on the upper side and the lower side of the oxide semiconductor film 716.

The insulating films on the upper side and the lower side of the oxide semiconductor film 716 may contain the same constituent element or different constituent elements. For example, the insulating films on the upper side and the lower side may be both formed using gallium oxide whose composition is $Ga_2O_X$ (X=3+α, 0<α<1). Alternatively, one of the insulating films on the upper side and the lower side may be formed using $Ga_2O_X$ (X=3+α, 0<α<1) and the other may be formed using aluminum oxide whose composition is $Al_2O_X$ (X=3+α, 0<α<1).

The insulating film which is in contact with the oxide semiconductor film 716 may be formed by a stack of insulating films each including a region where the proportion of oxygen is higher than that in the stoichiometric composition. For example, the insulating film on the upper side of the oxide semiconductor film 716 may be formed as follows: gallium oxide whose composition is $Ga_2O_X$ (X=3+α, 0<α<1) is formed and gallium aluminum oxide (aluminum gallium oxide) whose composition is $Ga_XAl_{2-X}O_{3+\alpha}$ (0<X<2, 0<α<1) may be formed thereover. Note that the insulating film on the lower side of the oxide semiconductor film 716 may be formed by a stack of insulating films each including a region where the proportion of oxygen is higher than that in the stoichiometric composition. Alternatively, both the insulating films on the upper side and the lower side of the oxide semiconductor film 716 may be formed by a stack of insulating films each including a region where the proportion of oxygen is higher than that in the stoichiometric composition.

Figure 11C:
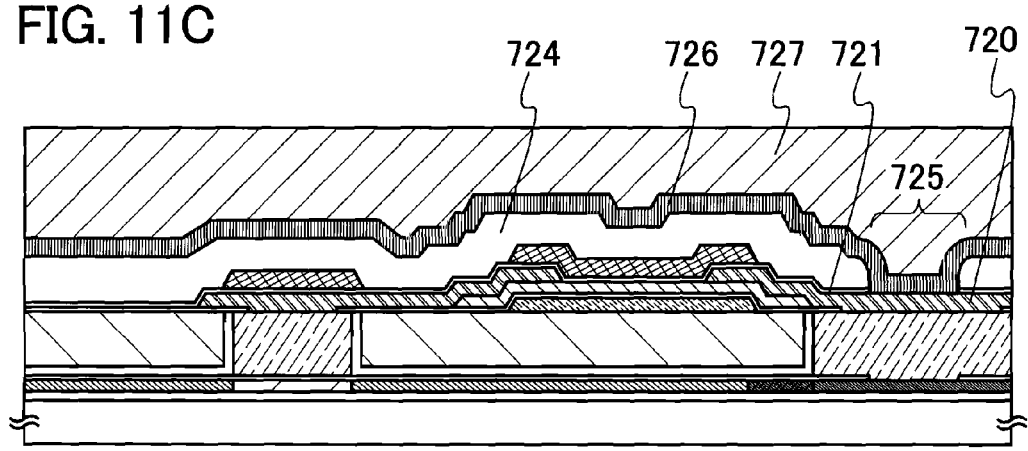

Next, as illustrated in FIG. 11C, an insulating film 724 is formed so as to cover the gate insulating film 721, the conductive film 723, and the gate electrode 722. The insulating film 724 can be formed by PVD, CVD, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the disclosed invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

A conductive film is formed by PVD or CVD and then is patterned, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening of the insulating film 724 by PVD and a thin titanium film (with a thickness of about 5 nm) is formed by PVD, and then, an aluminum film is formed so as to be embedded in the opening 725. Here, the titanium film formed by PVD has a function of reducing an oxide film (e.g., a native oxide film) formed on a surface over which the titanium film is formed, to decrease the contact resistance with the lower electrode or the like (here, the conductive film 720). In addition, hillocks of the aluminum film can be prevented. A copper film may be formed by a plating method after a barrier film of titanium, titanium nitride, or the like is formed.

The opening 725 formed in the insulating film 724 is preferably formed in a region overlapping with the conductive film 708. With provision of the opening 725 in such a region, the increase in element area due to a contact region can be prevented.

Here, the case where a connection position of the impurity region 704 and the conductive film 720 and a connection position of the conductive film 720 and the wiring 726 overlap with each other without the use of the conductive film 708 is described. In that case, an opening (also referred to as an opening in a lower portion) is formed in the insulating films 712 and 713 which are formed over the impurity region 704, and the conductive film 720 is formed so as to cover the opening in the lower portion. After that, an opening (also referred to as an opening in an upper portion) is formed in the gate insulating film 721 and the insulating film 724 in a region overlapping with the opening in the lower portion, and the wiring 726 is formed. When the opening in the upper portion is formed in the region overlapping with the opening in the lower portion, the conductive film 720 formed in the opening in the lower portion might be disconnected by etching. In order to avoid the disconnection, the openings in the lower portion and in the upper portion are formed so as not to overlap with each other, so that a problem of the increase in element area occurs.

As described in this embodiment, with the use of the conductive film 708, the opening in the upper portion can be formed without disconnection of the conductive film 720. Thus, the openings in the lower portion and in the upper portion can be formed so as to overlap with each other, so that the increase in element area due to the openings can be suppressed. That is, the semiconductor device can be highly integrated.

Next, an insulating film 727 is formed so as to cover the wiring 726. Through the series of steps, the memory device can be manufactured.

Note that in the manufacturing method, the conductive films 719 and 720 functioning as source and drain electrodes are formed after the formation of the oxide semiconductor film 716. Thus, as illustrated in FIG. 11B, in the transistor 101 obtained by the manufacturing method, the conductive films 719 and 720 are formed over the oxide semiconductor film 716. However, in the transistor 101, the conductive films functioning as source and drain electrodes may be formed below the oxide semiconductor film 716, that is, between the oxide semiconductor film 716 and the gate insulating film 715.

Figure 13:
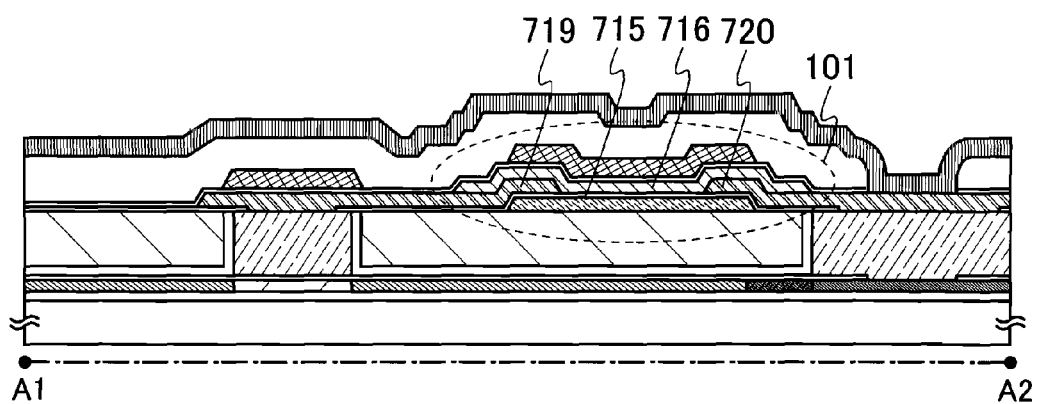
FIG. 13 is a cross-sectional view of a memory cell.

FIG. 13 illustrates a cross-sectional view of a memory cell at the time when the conductive films 719 and 720 functioning as source and drain electrodes are provided between the oxide semiconductor film 716 and the gate insulating film 715. The transistor 101 illustrated in FIG. 13 can be obtained in such a manner that the conductive films 719 and 720 are formed after the formation of the gate insulating film 715, and then, the oxide semiconductor film 716 is formed.

This embodiment can be combined with the above embodiment.

(Embodiment 3)

An example of a specific structure of a driver circuit in a memory device according to one embodiment of the present invention is described.

Figure 14:
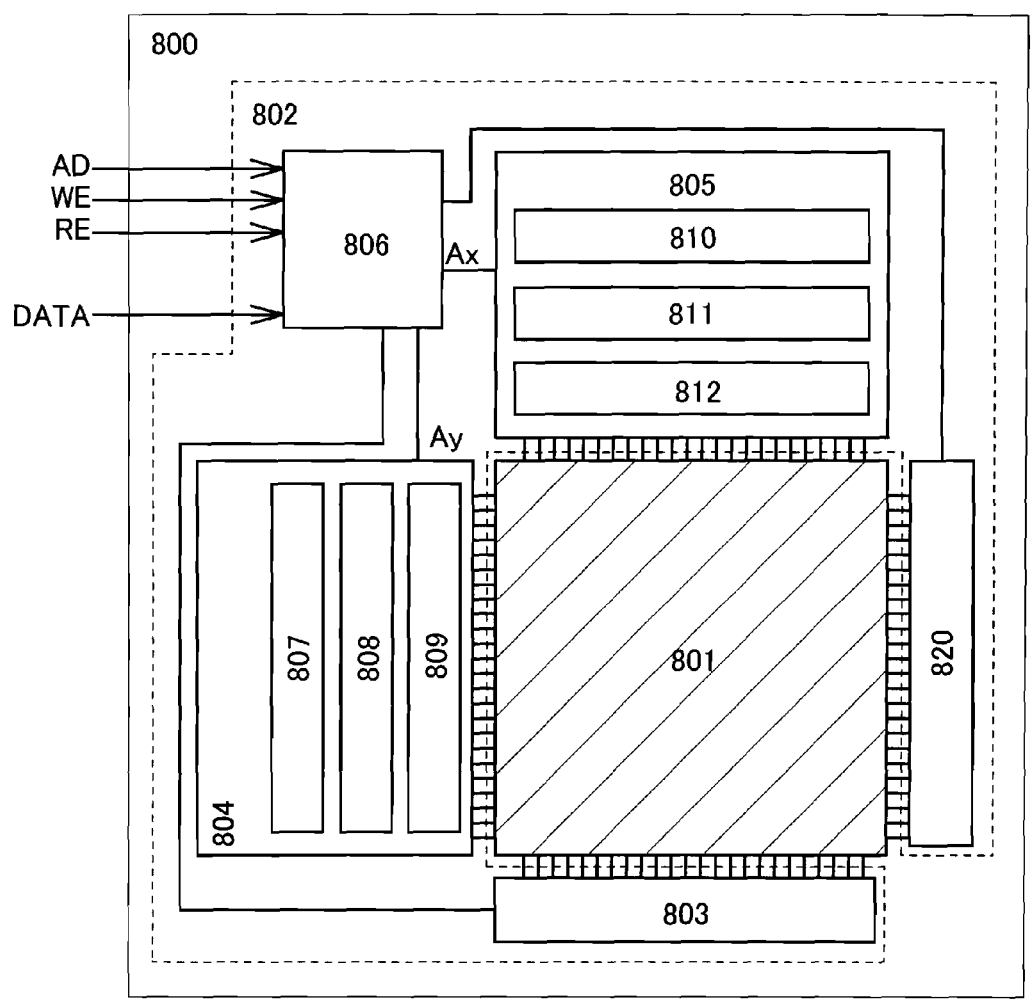
FIG. 14 is a block diagram of a memory device.

FIG. 14 illustrates a block diagram of a specific structure of a memory device according to one embodiment of the present invention. Note that in the block diagram illustrated in FIG. 14, circuits in the memory device are classified by their functions and independent blocks are illustrated. However, it is difficult to classify actual circuits by their functions completely and, in some cases, one circuit has a plurality of functions.

A memory device 400 illustrated in FIG. 14 includes a cell array 801 and a driver circuit 802. The driver circuit 802 includes a reading circuit 803 which generates a signal including data read from the cell array 801, a first word line driver circuit 804 which controls the potential of a first word line, a second word line driver circuit 820 which controls the potential of a second word line, and a bit line driver circuit 805 which controls data writing in a memory cell selected in the cell array 801. The driver circuit 802 further includes a control circuit 806 which controls the operation of the reading circuit 803, the first word line driver circuit 804, the second word line driver circuit 820, and the bit line driver circuit 805.

In the memory device 800 illustrated in FIG. 14, the first word line driver circuit 804 includes a decoder 807, a level shifter 808, and a buffer 809. The bit line driver circuit 805 includes a decoder 810, a level shifter 811, and a selector 812.

Note that it is acceptable as long as the memory device 800 according to one embodiment of the present invention includes at least the cell array 801. Further, the memory device 800 according to one embodiment of the present invention includes, in its category, a memory module in which part of the driver circuit 802 or the entire driver circuit 802 is connected to the cell array 801. The memory module may be provided with a connection terminal which can be mounted on a printed wiring board or the like and may be protected with a resin or the like, that is, may be packaged.

The cell array 801, the reading circuit 803, the first word line driver circuit 804, the second word line driver circuit 820, the bit line driver circuit 805, and the control circuit 806 may be formed using one substrate. Alternatively, any one of the cell array 801, the reading circuit 803, the first word line driver circuit 804, the second word line driver circuit 820, the bit line driver circuit 805, and the control circuit 806 may be formed using a substrate different from a substrate for the others, or all of them may be formed using different substrates.

In the case where different substrates are used, electrical connection can be secured with the use of an FPC (flexible printed circuit) or the like. In that case, part of the driver circuit 802 may be connected to an FPC by a COF (chip on film) method. Alternatively, electrical connection can be secured by COG (chip on glass).

When a signal AD including an address (Ax, Ay) of the cell array 801 as data is input to the memory device 800, the control circuit 806 transmits Ax which is data related to a column direction in the address and Ay which is data related to a row direction in the address to the bit line driver circuit 805 and the first word line driver circuit 804, respectively. In addition, the control circuit 806 transmits a signal DATA including data input to the memory device 800 to the bit line driver circuit 805.

Operation of writing data and operation of reading data in the cell array 801 is selected in accordance with a signal RE (read enable), a signal WE (write enable), or the like supplied to the control circuit 806. Further, in the case where the plurality of cell arrays 801 are provided, a signal CE (chip enable) for selecting the cell array 801 may be input to the control circuit 806. In that case, operation selected in accordance with the signal RE or the signal WE is performed in the cell array 801 selected in accordance with the signal CE.

In the cell array 801, when the writing operation is selected in accordance with the signal WE, a signal for selecting a memory cell corresponding to the address Ay is generated in the decoder 807 included in the first word line driver circuit 804 in response to an instruction from the control circuit 806. The amplitude of the signal is adjusted by the level shifter 808, and then the waveform of the signal is processed in the buffer 809 and the processed signal is input to the cell array 801. In the bit line driver circuit 805, a signal for selecting a memory cell corresponding to the address Ax among the memory cells selected in the decoder 810 is generated in response to an instruction from the control circuit 806. The amplitude of the signal is adjusted by the level shifter 811, and then the processed signal is input to the selector 812. In the selector 812, the signal DATA is sampled in accordance with the input signal, and the sampled signal is input to a memory cell corresponding to the address (Ax, Ay).

In the cell array 801, when the reading operation is selected in accordance with the signal RE, a signal for selecting a memory cell corresponding to the address Ay is generated in the decoder 807 included in the first word line driver circuit 804 in response to an instruction from the control circuit 806. The amplitude of the signal is adjusted by the level shifter 808, and then the waveform of the signal is processed in the buffer 809 and the processed signal is input to the cell array 801. In the reading circuit 803, a signal for selecting a memory cell corresponding to the address Ax among the memory cells selected in the decoder 807 is generated in response to an instruction from the control circuit 806. Data stored in the memory cell corresponding to the address (Ax, Ay) is read, and a signal including the data is generated.

The second word line driver circuit 820 supplies the potential of the second word line to the cell array 801.

This embodiment can be combined with any of the above embodiments as appropriate.

(Embodiment 4)

In this embodiment, an example of a specific structure of a reading circuit is described.

The levels of potentials read from the cell array are determined in accordance with data written to the memory cells. Accordingly, ideally, potentials having the same level should be read from the plurality of memory cells when data with the same digital value is stored in the plurality of memory cells. However, practically, the characteristics of transistors functioning as memory elements or transistors functioning as switching elements at the time of reading data might be varied among the memory cells. In that case, the potentials which are actually read are varied even when all the data to be read has the same digital value, so that the levels of the potentials can be widely distributed. Thus, it is preferable to provide, in the driver circuit, a reading circuit in which a signal including more accurate data and having an amplitude and a waveform processed in accordance with a desired specification can be generated even when potentials read from the cell array are slightly varied.

Figure 15:
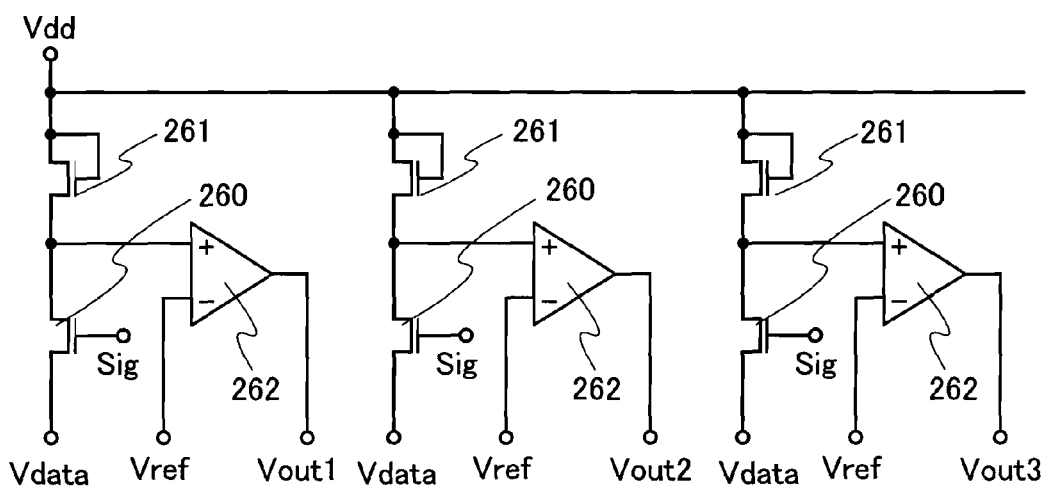
FIG. 15 is a circuit diagram of a reading circuit.

FIG. 15 is an example of a circuit diagram of a reading circuit. The reading circuit illustrated in FIG. 15 includes transistors 260 which function as switching elements for controlling the input of potentials Vdata read from a cell array to the reading circuit, and transistors 261 which function as resistors. The reading circuit illustrated in FIG. 15 further includes operational amplifiers 262.

Specifically, gate electrodes of the transistors 261 are connected to drain electrodes (or drain regions) of the transistors 261. In addition, a high-level power supply potential Vdd is applied to the gate electrodes and the drain electrodes of the transistors 261. Further, source electrodes of the transistors 261 are connected to non-inversion input terminals (+) of the operational amplifiers 262. Accordingly, the transistors 261 function as resistors connected between nodes to which the power supply potential Vdd is applied and the non-inversion input terminals (+) of the operational amplifiers 262. Note that although a transistor whose gate electrode is connected to a drain electrode is used as a resistor in FIG. 15, the present invention is not limited to this. An element functioning as a resistor can be used.

The transistor 260 functioning as a switching element controls the supply of a potential Vdata to a source electrode of the transistor 260 in accordance with a potential of a signal Sig applied to a gate electrode of the transistor 260.

For example, when the transistor 260 is turned on, a potential obtained by resistive division of the potential Vdata and the power supply potential Vdd with the use of the transistor 260 and the transistor 261 is applied to the non-inversion input terminal (+) of the operational amplifier 262. Since the level of the power supply potential Vdd is fixed, the level of the potential obtained by resistive division reflects the level of the potential Vdata, i.e., a digital value of read data.

In contrast, a reference potential Vref is applied to inversion input terminals (−) of the operational amplifiers 262. The levels of potentials Vout of output terminals can be varied depending on the level of the potential applied to the inversion input terminals (−) with respect to the reference potential Vref. Thus, a signal which indirectly includes data can be obtained.

Note that even if data with the same value is stored in memory cells, fluctuation in levels of the read potential Vdata occurs due to variation in characteristics of the memory cells, so that the levels of potentials might be widely distributed. Thus, the level of the reference potential Vref is determined in consideration of fluctuation in the potential Vdata of the node in order to read the value of data accurately.

Since FIG. 15 illustrates an example of a reading circuit at the time when a binary digital value is used, one operational amplifier used for reading data is used for one node to which the potential Vdata is applied. However, the number of operational amplifiers is not limited to this. When n-valued data (n is a natural number of 2 or more) is used, the number of operational amplifiers used for one node to which the potential Vdata is applied is (n−1).

This embodiment can be combined with any of the above embodiments as appropriate.

(Embodiment 5)

In this embodiment, a structure example of an RF tag which is one of semiconductor devices of the present invention is described.

Figure 16:
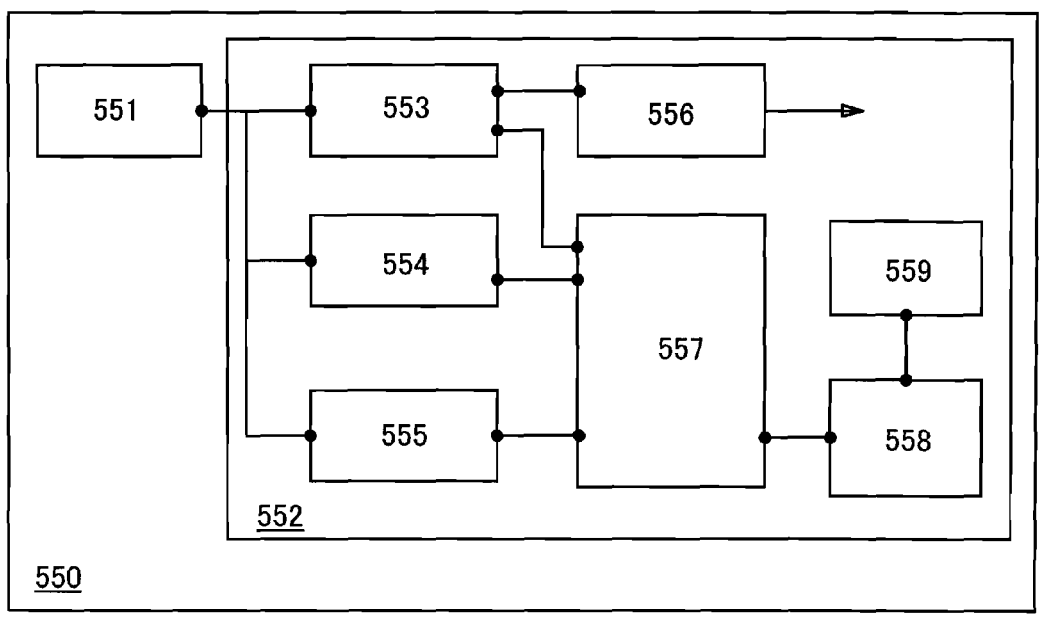
FIG. 16 is a block diagram of an RF tag.

FIG. 16 is a block diagram illustrating one aspect of an RF tag of the present invention. In FIG. 16, an RF tag 550 includes an antenna circuit 551 and an integrated circuit 552. The integrated circuit 552 includes a power supply circuit 553, a demodulation circuit 554, a modulation circuit 555, a regulator 556, an arithmetic circuit 557, a memory device 558, and a step-up circuit 559.

Then, an operation example of the RF tag 550 is described. When a radio wave is transmitted from an interrogator, the radio wave is converted into AC voltage in the antenna circuit 551. In the power supply circuit 553, the AC voltage from the antenna circuit 551 is rectified and power supply voltage is generated. The power supply voltage that is generated in the power supply circuit 553 is applied to the arithmetic circuit 557 and the regulator 556. After stabilizing the power supply voltage from the power supply circuit 553 or after adjusting the level of the voltage, the regulator 556 supplies the voltage to circuits such as the demodulation circuit 554, the modulation circuit 555, the arithmetic circuit 557, the memory device 558, or the step-up circuit 559 in the integrated circuit 552.

The demodulation circuit 554 demodulates an AC signal received by the antenna circuit 551 and outputs the signal to the arithmetic circuit 557 in the next stage. The arithmetic circuit 557 performs arithmetic processing in accordance with the signal input from the demodulation circuit 554 and generates another signal. In the arithmetic processing, the memory device 558 can be used as a primary cache memory or a secondary cache memory. Further, the arithmetic circuit 557 analyzes the signal input from the demodulation circuit 554 and outputs data in the memory device 558 or executes an instruction in the memory device 558 in response to an instruction transmitted from the interrogator. The signal output from the arithmetic circuit 557 is encoded and transmitted to the modulation circuit 555. The modulation circuit 555 modulates a radio wave received by the antenna circuit 551 in accordance with the signal. The radio wave modulated in the antenna circuit 551 is received by the interrogator.

In this manner, communication between the RF tag 550 and the interrogator is performed by modulation of a radio wave used as a carrier (a carrier wave). The frequency of the carrier wave is 125 kHz, 13.56 MHz, 950 MHz, or the like, which varies depending on the standard. There are various modulation methods such as amplitude modulation, frequency modulation, and phase modulation, depending on the standard; however, any modulation method may be employed as long as it is based on the standard.

Signal transmission methods can be classified into a variety of kinds such as an electromagnetic coupling method, an electromagnetic induction method, a microwave method, and the like, depending on the wavelength of a carrier.

The step-up circuit 559 raises voltage output from the regulator 556 and supplies the voltage to the memory device 558.

Note that in the case where the RF tag 550 is a passive tag, a DC potential is not supplied to the RF tag 550 from an external power source. Thus, in the case where the second word line driver circuit 150 illustrated in FIG. 7 is provided in the passive RF tag 550, the potential VSS is not supplied from the outside to the terminal A. Accordingly, in one embodiment of the present invention, in the case where the RF tag 550 is a passive tag, a circuit for generating a negative potential, such as a charge-pump circuit, is provided in the power supply circuit 553. With the structure, the potential VSS can be supplied from the power supply circuit 553 to the terminal A in the second word line driver circuit 150 illustrated in FIG. 7; thus, the data retention characteristics of the memory device can be improved.

In one embodiment of the present invention, the memory device 558 has the structure described in the above embodiment; thus, data can be retained for a long time and the frequency of rewrite of data can be increased. Accordingly, in the RF tag 550 according to one embodiment of the present invention, the reliability of data can be increased with the use of the memory device 558.

In addition, in one embodiment of the present invention, the memory device 558 has the structure described in the above embodiment; thus, power consumption can be reduced. Accordingly, in the RF tag 550 according to one embodiment of the present invention, power consumed in the RF tag 550 can be reduced; thus, the communication distance between the interrogator and the RF tag 550 can be extended.

In this embodiment, the structure of the RF tag 550 including the antenna circuit 551 is described; however, the RF tag according to one embodiment of the present invention does not necessarily include an antenna circuit. In addition, the RF tag illustrated in FIG. 16 may include an oscillation circuit or a secondary battery.

This embodiment can be combined with any of the above embodiments as appropriate.

(Embodiment 6)

In this embodiment, an example of a portable storage medium which is one of semiconductor devices including memory devices according to one embodiment of the present invention is described.

Figure 17A:
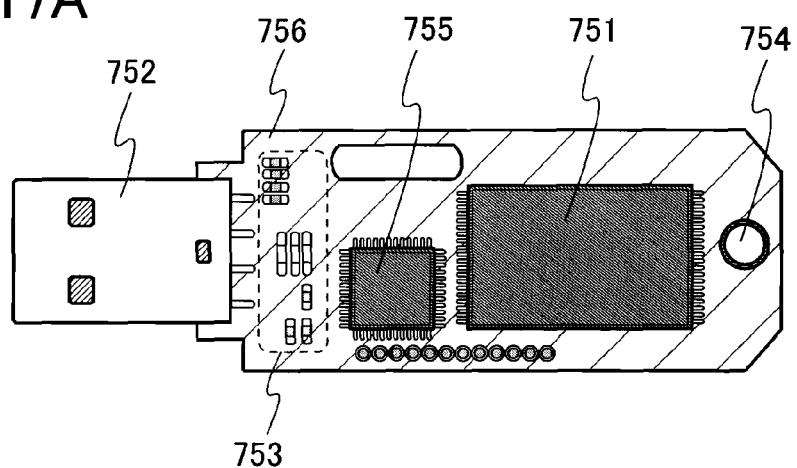
FIGS. 17A and 17B illustrate structures of a storage medium.

FIG. 17A illustrates the structure of a storage medium according to one embodiment of the present invention. In the storage medium illustrated in FIG. 17A, the following components are mounted on a printed wiring board 756: a memory device 751 according to one embodiment of the present invention; a connector 752 which performs electrical connection between a driver circuit and the storage medium; an interface 753 which performs signal processing on each signal input or output through the connector 752 in accordance with the various signals; a light-emitting diode 754 which emits light in accordance with the operation of the storage medium or the like; and a controller 755 which controls the operation of circuits and semiconductor elements in the storage medium, such as the memory device 751, the interface 753, and the light-emitting diode 754. Further, a quartz oscillator which is used for generating a clock signal for controlling the operation of the controller 755, a regulator for controlling the level of a power supply potential in the storage medium, or the like may be provided.

Figure 17B:
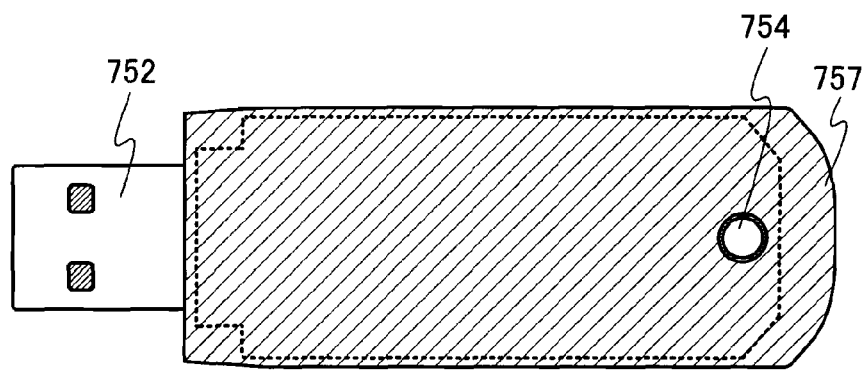

As illustrated in FIG. 17B, the printed wiring board 756 in FIG. 17A may be protected by being covered with a cover material 757 using a resin or the like so that part of the connector 752 and part of the light-emitting diode 754 are exposed.

Since in the memory device 751 according to one embodiment of the present invention, power consumption in operation can be reduced, power consumption of the storage medium using the memory device 751 and power consumption of a driving device connected to a recording medium can be reduced. Further, since in the memory device 751 according to one embodiment of the present invention, data can be retained for a long time and the frequency of rewrite of data can be increased, the reliability of the storage medium can be increased.

This embodiment can be combined with any of the above embodiments as appropriate.

[Example 1]

A semiconductor device according to one embodiment of the present invention is used, so that a highly-reliable electronic device, a low-power electronic device, and an electronic device with high-speed driving can be provided. In particular, in the case where a portable electronic device which has difficulty in continuously receiving power, an advantage of an increase in continuous operating time can be obtained when a low-power semiconductor device according to one embodiment of the present invention is added as a component of the device.

Figure 18A:
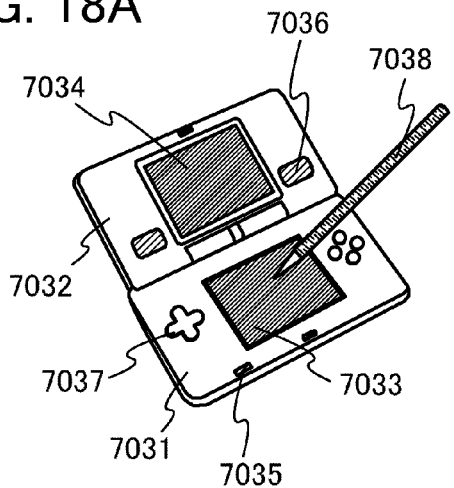
FIGS. 18A to 18C illustrate electronic devices.
Figure 18B:
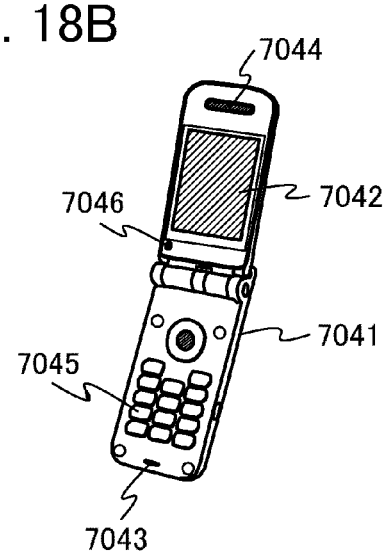
Figure 18C:
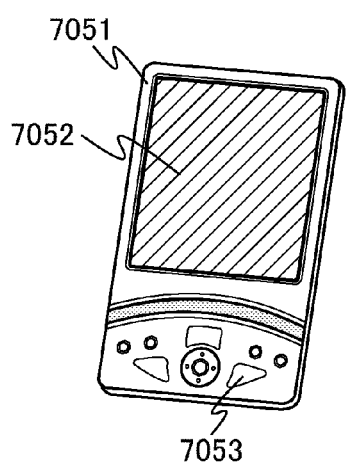

The semiconductor device according to one embodiment of the present invention can be used for display devices, laptops, or image reproducing devices provided with recording media (typically, devices which reproduce the content of recording media such as digital versatile discs (DVDs) and have displays for displaying the reproduced images). Further, as an electronic device which can include the semiconductor device according to one embodiment of the present invention, cellular phones, portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 18A to 18C illustrate specific examples of these electronic devices.

FIG. 18A illustrates a portable game machine, which includes a housing 7031, a housing 7032, a display portion 7033, a display portion 7034, a microphone 7035, a speaker 7036, an operation key 7037, a stylus 7038, and the like. The semiconductor device according to one embodiment of the present invention can be used for an integrated circuit for controlling driving of the portable game machine. With the use of the semiconductor device according to one embodiment of the present invention for the integrated circuit for controlling the driving of the portable game machine, a highly-reliable portable game machine and a multifunctional portable game machine can be provided. Although the portable game machine illustrated in FIG. 18A has the two display portions 7033 and 7034, the number of display portions included in the portable game machine is not limited to this.

FIG. 18B illustrates a cellular phone, which includes a housing 7041, a display portion 7042, an audio input portion 7043, an audio output portion 7044, operation keys 7045, a light reception portion 7046, and the like. Light received in the light reception portion 7046 is converted into electric signals, so that external images can be loaded. The semiconductor device according to one embodiment of the present invention can be used for an integrated circuit for controlling driving of the cellular phone. With the use of the semiconductor device according to one embodiment of the present invention for the integrated circuit for controlling the driving of the cellular phone, a highly-reliable cellular phone and a multifunctional cellular phone can be provided.

FIG. 18C illustrates a personal digital assistant, which includes a housing 7051, a display portion 7052, operation keys 7053, and the like. In the personal digital assistant illustrated in FIG. 18C, a modem may be incorporated in the housing 7051. The semiconductor device according to one embodiment of the present invention can be used for an integrated circuit for controlling driving of the personal digital assistant. With the use of the semiconductor device according to one embodiment of the present invention for the integrated circuit for controlling the driving of the personal digital assistant, a highly-reliable personal digital assistant and a multifunctional personal digital assistant can be provided.

This example can be combined with any of the above embodiments as appropriate.

REFERENCE NUMERALS

100: memory cell, 101: transistor, 102: capacitor, 103: transistor, 104: transistor, 110: substrate, 111: gate electrode, 112: insulating film, 113: oxide semiconductor film, 114: source electrode, 115: drain electrode, 116: insulating film, 117: gate electrode, 118: insulating film, 120: line, 121: line, 150: second word line driver circuit, 151: transistor, 152: capacitor, 200: cell array, 260: transistor, 261: transistor, 262: operational amplifier, 300: cell array, 550: RF tag, 551: antenna circuit, 552: integrated circuit, 553: power supply circuit, 554: demodulation circuit, 555: modulation circuit, 556: regulator, 557: arithmetic circuit, 558: memory device, 559: step-up circuit, 700: substrate, 701: insulating film, 702: semiconductor film, 703: gate insulating film, 704: impurity region, 705: mask, 706: opening, 707: gate electrode, 708: conductive film, 709: impurity region, 710: channel formation region, 711: impurity region, 712: insulating film, 713: insulating film, 714: gate electrode, 715: gate insulating film, 716: oxide semiconductor film, 717: opening, 718: opening, 719: conductive film, 720: conductive film, 721: gate insulating film, 722: gate electrode, 723: conductive film, 724: insulating film, 725: opening, 726: wiring, 727: insulating film, 751: memory device, 752: connector, 753: interface, 754: light-emitting diode, 755: controller, 756: printed wiring board, 757: cover material, 800: memory device, 801: cell array, 802: driver circuit, 803: circuit, 804: first word line driver circuit, 805: bit line driver circuit, 806: control circuit, 807: decoder, 808: level shifter, 809: buffer, 810: decoder, 811: level shifter, 812: selector, 820: second word line driver circuit, 7031: housing, 7032: housing, 7033: display portion, 7034: display portion, 7035: microphone, 7036: speaker, 7037: operation key, 7038: stylus, 7041: housing, 7042: display portion, 7043: audio input portion, 7044: audio output portion, 7045: operation key, 7046: light reception portion, 7051: housing, 7052: display portion, and 7053: operation key.

This application is based on Japanese Patent Application serial No. 2010-190344 filed with Japan Patent Office on Aug. 27, 2010, the entire contents of which are hereby incorporated by reference.

The invention claimed is:

1. An electronic device comprising:
a driving circuit comprising a first transistor and a first capacitor; and
a memory cell array circuit comprising a second transistor and a memory element,
wherein each of the first transistor and the second transistor comprises an oxide semiconductor layer, a first gate electrode, a source electrode and a drain electrode,
wherein the second transistor comprises a gate insulating film between the oxide semiconductor layer and the first gate electrode,
wherein the first capacitor comprises a first electrode and a second electrode,
wherein the memory element is electrically connected to one of the source electrode and the drain electrode of the second transistor,
wherein the source electrode and the drain electrode of the first transistor are electrically connected to the oxide semiconductor layer of the first transistor,
wherein the source electrode and the drain electrode of the second transistor are electrically connected to the oxide semiconductor layer of the second transistor,
wherein the first gate electrode and one of the source electrode and the drain electrode of the first transistor are electrically connected to the first electrode of the first capacitor,
wherein a constant electrical potential is supplied to the other of the source electrode and the drain electrode of the first transistor, and
wherein an electrical potential of the first gate electrode of the second transistor is substantially equal to an electrical potential of the first electrode of the first capacitor at any time.

2. The electronic device according to claim 1,
wherein the memory element is a second capacitor.

3. The electronic device according to claim 1,
wherein the memory element comprises a third transistor,
wherein the third transistor comprises a gate electrode, and
wherein the one of the source electrode and the drain electrode of the second transistor is electrically connected to the gate electrode of the third transistor.

4. The electronic device according to claim 1,
wherein the first transistor comprises a second gate electrode,
wherein the second transistor comprises a second gate electrode, and
wherein the second gate electrode of the first transistor is electrically connected to the first electrode of the first capacitor.

5. The electronic device according to claim 4,
wherein a potential of the first electrode of the first capacitor is configured to be always lower than the lowest potential of the second gate electrode of the second transistor.

6. The electronic device according to claim 4,
wherein the oxide semiconductor layer of the first transistor is interposed between the first gate electrode and the second gate electrode of the first transistor, and
wherein the oxide semiconductor layer of the second transistor is interposed between the first gate electrode and the second gate electrode of the second transistor.

7. An electronic device comprising:
a driving circuit comprising a first transistor and a first capacitor; and
a memory cell comprising a second transistor and a memory element,
wherein each of the first transistor and the second transistor comprises an oxide semiconductor layer, a first gate electrode, a source electrode and a drain electrode,
wherein the second transistor comprises a gate insulating film between the oxide semiconductor layer and the first gate electrode,
wherein the first capacitor comprises a first electrode and a second electrode,
wherein the memory element is electrically connected to one of the source electrode and the drain electrode of the second transistor,
wherein the source electrode and the drain electrode of the first transistor are electrically connected to the oxide semiconductor layer of the first transistor,
wherein the source electrode and the drain electrode of the second transistor are electrically connected to the oxide semiconductor layer of the second transistor,
wherein the first gate electrode and one of the source electrode and the drain electrode of the first transistor are electrically connected to the first electrode of the first capacitor,
wherein a constant electrical potential is supplied to the other of the source electrode and the drain electrode of the first transistor, and wherein an electrical potential of the first gate electrode of the second transistor is substantially equal to an electrical potential of the first electrode of the first capacitor at any time.

8. The electronic device according to claim 7, wherein the memory element is a second capacitor.

9. The electronic device according to claim 7,
wherein the memory element comprises a third transistor,
wherein the third transistor comprises a gate electrode, and
wherein the one of the source electrode and the drain electrode of the second transistor is electrically connected to the gate electrode of the third transistor.

10. The electronic device according to claim 7,
wherein the first transistor comprises a second gate electrode,
wherein the second transistor comprises a second gate electrode, and
wherein the second gate electrode of the first transistor is electrically connected to the first electrode of the first capacitor.

11. The electronic device according to claim 10,
wherein a potential of the first electrode of the first capacitor is configured to be always lower than the lowest potential of the second gate electrode of the second transistor.

12. The electronic device according to claim 10,
wherein the oxide semiconductor layer of the first transistor is interposed between the first gate electrode and the second gate electrode of the first transistor, and
wherein the oxide semiconductor layer of the second transistor is interposed between the first gate electrode and the second gate electrode of the second transistor.

* * * * *